United States Patent
Makigawa et al.

(10) Patent No.: US 12,378,422 B2
(45) Date of Patent: *Aug. 5, 2025

(54) CONDUCTIVE COMPOSITION AND PRODUCTION METHOD THEREFOR, AND WATER-SOLUBLE POLYMER AND PRODUCTION METHOD THEREFOR

(71) Applicant: Mitsubishi Chemical Corporation, Tokyo (JP)

(72) Inventors: Saki Makigawa, Tokyo (JP); Shinji Saiki, Tokyo (JP); Yoshiko Irie, Tokyo (JP); Masashi Uzawa, Tokyo (JP); Akira Yamazaki, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 112 days.

This patent is subject to a terminal disclaimer.

(21) Appl. No.: 18/147,108

(22) Filed: Dec. 28, 2022

(65) Prior Publication Data
US 2023/0135022 A1   May 4, 2023

Related U.S. Application Data

(63) Continuation of application No. 16/931,635, filed on Jul. 17, 2020, now Pat. No. 11,572,479, which is a continuation of application No. PCT/JP2019/002337, filed on Jan. 24, 2019.

(30) Foreign Application Priority Data

Jan. 26, 2018  (JP) ................. 2018-011446

(51) Int. Cl.
| | |
|---|---|
| C09D 5/24 | (2006.01) |
| C08F 26/10 | (2006.01) |
| C09D 7/65 | (2018.01) |
| C09D 179/02 | (2006.01) |
| G03F 7/11 | (2006.01) |
| H01B 1/12 | (2006.01) |

(52) U.S. Cl.
CPC ............. C09D 5/24 (2013.01); C08F 26/10 (2013.01); C09D 7/65 (2018.01); C09D 179/02 (2013.01); G03F 7/11 (2013.01); H01B 1/124 (2013.01)

(58) Field of Classification Search
CPC .......... C09D 5/24; C09D 7/65; C09D 179/02; C08F 26/10; C08F 126/10; G03F 7/11; H01B 1/124; H01B 1/12; H01B 1/20; H01B 13/00; H01B 1/128; C08L 79/02; C08L 65/00; C08L 101/12; C08L 39/06; C08G 2261/3221; C08G 2261/3223; C08G 2261/43; Y02E 60/10
See application file for complete search history.

(56) References Cited

U.S. PATENT DOCUMENTS

| | | |
|---|---|---|
| 6,462,013 B1 | 10/2002 | Cooke, Jr. et al. |
| 2006/0202171 A1 | 9/2006 | Yoshida et al. |
| 2015/0132537 A1* | 5/2015 | Fukuda .................. C09D 5/24 428/141 |

(Continued)

FOREIGN PATENT DOCUMENTS

| | | |
|---|---|---|
| CN | 102643376 A | 8/2012 |
| CN | 105637037 A | 6/2016 |

(Continued)

OTHER PUBLICATIONS

Office Action issued May 19, 2023, in corresponding European Patent Application No. 19 743 646.2, 5 pages.
Anonymous: "Radical Polymerization", Encyclopedia of Polymer Science and Technology, vol. 11, Oct. 15, 2003, pp. 359-473, XP055566047.
Bon S. A. F. et al., "Use of Methyl 2-(Bromomethyl)acrylate as a Chain-Transfer Agent to Yield Functionalized Macromonomers via Conventional and Living Radical Polymerizations", Macromolecules, American Chemical Society, US, vol. 33, No. 16, Aug. 8, 2000, pp. 5819-5824, XP001065725, ISSN: 0024-9297, DOI: 10.1021/MA991922T.

(Continued)

*Primary Examiner* — Mark Kopec
*Assistant Examiner* — Jaison P Thomas
(74) *Attorney, Agent, or Firm* — Oblon, McClelland, Maier & Neustadt, L.L.P.

(57) ABSTRACT

A conductive composition may include a conductive polymer (A), a water-soluble polymer (B), and a solvent (C1). The water-soluble polymer (B) may include a water-soluble polymer (B11) of formula (11), and a water-soluble polymer (B2) of formula (2) as the water-soluble polymer (B) of 0.15% by mass or less, based on a total mass of the conductive composition:

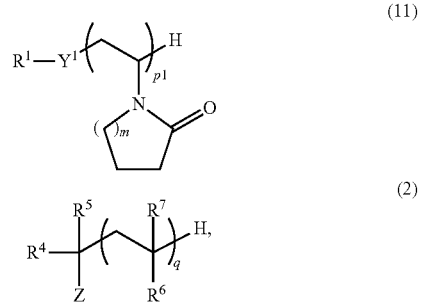

wherein $R^1$ is a linear or branched alkyl group with 6 to 20 carbon atoms, each of $R^4$ and $R^5$ is independently a methyl or ethyl group, $R^6$ is a hydrophilic group, $R^7$ is H or a methyl group, $Y^1$ is a single bond, —S—, —S(=O)—, —C(=O)—O—, or —O—, Z is a cyano group or a hydroxy group, each of p1 and q is an average number of repetitions, and is a number of from 1 to 50, and m is a number of from 1 to 5.

20 Claims, No Drawings

(56) References Cited

U.S. PATENT DOCUMENTS

2015/0141600 A1    5/2015   Wang et al.
2021/0051957 A1    2/2021   Sherry et al.

FOREIGN PATENT DOCUMENTS

| | | |
|---|---|---|
| EP | 0 544 158 A1 | 6/1993 |
| EP | 0 967 266 A1 | 12/1999 |
| JP | 5-310822 A | 11/1993 |
| JP | 2000-26900 A | 1/2000 |
| JP | 2002-226721 A | 8/2002 |
| JP | 2017-39927 A | 2/2017 |
| KR | 10-2014-0134310 A | 11/2014 |
| TW | 201413748 A | 4/2014 |
| WO | WO 2014/017540 A1 | 1/2014 |
| WO | WO 2016/043620 A1 | 3/2016 |

OTHER PUBLICATIONS

International Search Report issued Apr. 16, 2019 in PCT/JP2019/002337 filed Jan. 24, 2019, 5 pages.
Extended European Search Report issued Feb. 19, 2021 in corresponding European Patent Application No. 19743646.2, 7 pages.
Combined Chinese Office Action and Search Report issued Sep. 27, 2021 in Patent Application No. 201980008837.1 (with English language translation), 23 pages.
Combined Taiwanese Office Action and Search Report issued Mar. 17, 2022, in corresponding Taiwanese Patent Application No. 108102785 (with English Translation), 19 pages.
Japanese Office Action issued Jun. 14, 2022 in Japanese Patent Application No. 2019-567159 (with unedited computer generated English Translation), 14 pages.
Chinese Office Action issued Jun. 27, 2022 in Chinese Patent Application No. 201980008837.1 (with unedited computer generated English Translation), 16 pages.
Korean Office Action issued Apr. 7, 2023 in Korean Patent Application No. 10-2020-7020560 (with unedited computer-generated English Translation), 8 pages.
Taiwanese Office Action issued Aug. 19, 2024 in Taiwanese Patent Application No. 108102785 (with unedited computer-generated English translation), 31 pages.
Combined Taiwanese Office Action and Search Report issued Aug. 19, 2024 in Taiwanese Patent Application No. 112143484 (with unedited computer-generated English translation), 36 pages.

* cited by examiner

CONDUCTIVE COMPOSITION AND PRODUCTION METHOD THEREFOR, AND WATER-SOLUBLE POLYMER AND PRODUCTION METHOD THEREFOR

This application is a continuation application of U.S. Ser. No. 16/931,635 filed on Jul. 17, 2020, allowed, which is a continuation application of International Application No. PCT/JP2019/002337, filed on Jan. 24, 2019, which claims priority to Japanese Patent Application No. 2018-011446, filed Jan. 26, 2018, the entire contents of which are incorporated herein by reference.

TECHNICAL FIELD

The present invention relates to a conductive composition and a method for producing the same, and a water-soluble polymer and a method for producing the same.

BACKGROUND ART

Patterning techniques using charged particle beams such as electron beams and ion beams are promising candidates of the next generation technology of photolithography.

For improving the productivity with the use of charged particle beams, it is important to improve the sensitivity of the resist. From this perspective, the mainstream process uses a highly sensitive chemically amplified resist that is allowed to generate an acid in its area exposed to light or irradiated with the charged particle beam, which is followed by a heat treatment called "post exposure bake (PEB)" to accelerate crosslinking reaction or decomposition reaction.

Incidentally, especially when the substrate is insulating, the patterning method using charged particle beams has a problem that the trajectory of the charged particle beam is bent due to an electric field generated by the charge (charge up) of the substrate, resulting in difficulty in obtaining a desired pattern.

As a means to solve this problem, there is a technique already known to be effective, which applies a conductive composition containing a conductive polymer to a surface of a resist layer to form a coating film so as to coat the surface of the resist layer, thereby imparting an antistatic function to the resist layer.

In general, when a conductive composition containing a conductive polymer is applied as an antistatic agent in an electron beam lithography process for a semiconductor, there is a trade-off relationship between the coatability of the conductive composition and the influence thereof on a substrate or a coating layer such as a resist coated on the substrate.

For example, the addition of an additive such as a surfactant for improving the coatability of the conductive composition poses a problem that the surfactant adversely affects the resist characteristics and a predetermined pattern cannot be obtained.

Addressing such a problem, Patent Document 1 proposes a conductive composition including a water-soluble polymer having a nitrogen-containing functional group and a hydrophobic terminal group as a conductive composition that excels in coatability and the like.

DESCRIPTION OF PRIOR ART

Patent Document

Patent Document 1: Japanese Unexamined Patent Application Publication No. 2002-226721

DISCLOSURE OF INVENTION

Problems to be Solved by the Invention

However, there is still room for improvement in the conductivity of the coating film obtained from the conductive composition described in patent document 1, and further improvement of the conductivity is desired.

The purpose of the present invention is to provide a conductive composition which can form a coating film with excellent conductivity and has excellent coatability, and a method for producing the same. Further purpose of the present invention is to provide a water-soluble polymer contained in the conductive composition and a method for producing the same.

Means to Solve the Problems

The embodiments of the present invention are as follows.

[1] A conductive composition including a conductive polymer (A), a water-soluble polymer (B), and a solvent (C1), wherein:

the water-soluble polymer (B) comprises a water-soluble polymer (B11) represented by formula (11), and an amount of a water-soluble polymer (B2) represented by formula (2) as the water-soluble polymer (B) is 0.15% by mass or less, based on a total mass of the conductive composition:

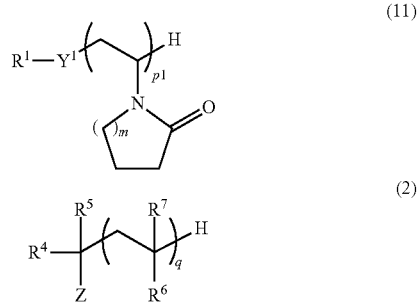

In the formula (11), $R^1$ denotes a linear or branched alkyl group with 6 to 20 carbon atoms, $Y^1$ denotes a single bond, —S—, —S(=O)—, —C(=O)—O— or —O—, p1 denotes an average number of repetitions and is a number of from 1 to 50, and m denotes a number of from 1 to 5.

In the formula (2), each of $R^4$ and $R^5$ independently denotes a methyl or ethyl group, $R^6$ denotes a hydrophilic group, $R^7$ denotes a hydrogen atom or a methyl group, Z denotes a cyano group or a hydroxy group, and q denotes an average number of repetitions and is a number of from 1 to 50.

[2] A conductive composition including a conductive polymer (A), a water-soluble polymer (B), a solvent (C1), and a basic compound (D), wherein:

the water-soluble polymer (B) includes a water-soluble polymer (B1) represented by formula (1), and an amount of a water-soluble polymer (B2) represented by formula (2) as the water-soluble polymer (B) is 0.15% by mass or less, based on a total mass of the conductive composition:

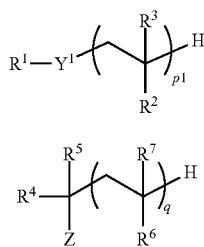

(1)

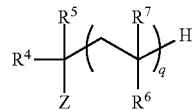

(2)

In the formula (1), $R^1$ denotes a linear or branched alkyl group with 6 to 20 carbon atoms, $R^2$ denotes a hydrophilic group, $R^3$ denotes a hydrogen atom or a methyl group, $Y^1$ denotes a single bond, —S—, —S(=O)—, —C(=O)—O— or —O—, and p1 denotes an average number of repetitions and is a number of from 1 to 50.

In the formula (2), each of $R^4$ and $R^5$ independently denotes a methyl or ethyl group, $R^6$ denotes a hydrophilic group, $R^7$ denotes a hydrogen atom or a methyl group, Z denotes a cyano group or a hydroxy group, and q denotes an average number of repetitions and is a number of from 1 to 50.

[3] The conductive composition according to [1] or [2], wherein a water/octanol partition coefficient (Log P) for polymerization initiator-derived components in the water-soluble polymer (B) is 8.50 or more.

[4] The conductive composition according to any one of [1] to [3], wherein the conductive polymer (A) is polyaniline sulfonic acid.

[5] A water-soluble polymer represented by formula (3):

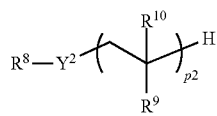

(3)

In the formula (3), $R^8$ denotes a linear or branched alkyl group with 6 to 20 carbon atoms, $R^9$ denotes a hydrophilic group, $R^{10}$ denotes a hydrogen atom or a methyl group, $Y^2$ denotes a single bond, —C(=O)—O— or —O—, and p2 denotes an average number of repetitions and is a number of more than 1 and not more than 50.

[6] A method for producing a water-soluble polymer (B) including a water-soluble polymer (B1) represented by formula (1), the method including a polymerization step of polymerizing a water-soluble vinyl monomer in a solvent (C2) satisfying condition 1 in the presence of a polymerization initiator having a terminal hydrophobic group:

Condition 1: a chain transfer constant of methyl acrylate to the solvent (C2) at 50° C. is 0.001 or less.

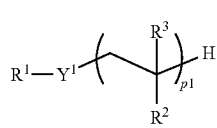

(1)

In the formula (1), $R^1$ denotes a linear or branched alkyl group with 6 to 20 carbon atoms, $R^2$ denotes a hydrophilic group, $R^3$ denotes a hydrogen atom or a methyl group, $Y^1$ denotes a single bond, —S—, —S(=O)—, —C(=O)—O— or —O—, and p1 denotes an average number of repetitions and is a number of from 1 to 50.

[7] The method according to [6], wherein the polymerization step is performed in the presence of a chain transfer agent having a terminal hydrophobic group.

[8] A method for producing a conductive composition, comprising a step of producing the water-soluble polymer (B) by the method of [6] or [7], and a step of mixing the obtained water-soluble polymer (B) with a conductive polymer (A) and a solvent (C1).

Effect of the Invention

The present invention can provide a conductive composition which can form a coating film with excellent conductivity and has excellent coatability, and a method for producing the same. Further, the present invention can also provide a water-soluble polymer contained in the conductive composition and a method for producing the same.

DESCRIPTION OF THE EMBODIMENTS

Hereinbelow, the present invention will be described in detail.

In the present invention, the term "conductive" means that a volume resistivity is $1 \times 10^{10}$ Ω·cm or less. The volume resistivity is determined from the surface resistivity determined from the potential difference between electrodes when a constant current is flown between the electrodes, and the thickness of the coating film used to determine the surface resistivity.

In the present invention, the term "water/octanol partition coefficient (Log P) for polymerization initiator-derived components in the water-soluble polymer (B)" refers to a concentration ratio of the polymerization initiator-derived components in water and octanol when the water-soluble polymer (B) is dissolved in a mixture of water and octanol (mixing ratio is arbitrary). In the present invention, the term "Log P" refers to a value calculated with CambridgeSoft's ChemDraw Pro 12.0.

Further, in the context of the present specification, the term "solubility" means that 0.1 g or more of a substance dissolves uniformly in 10 g (liquid temperature 25° C.) of simple water, water containing at least one of a base and a basic salt, water containing an acid, or a mixture of water and a water-soluble organic solvent. Furthermore, the term "water-soluble" means the solubility in water in relation to the aforementioned solubility.

In the context of the present specification, the "terminal" of the "terminal hydrophobic group" means a molecular terminal or a site other than repeating units constituting a polymer.

Further, in the context of the present specification, the term "weight average molecular weight" refers to a weight average molecular weight (in terms of sodium polystyrene sulfonate or polyethylene glycol) as measured by gel permeation chromatography (GPC).

[Conductive Composition]

First Embodiment

The conductive composition of the first embodiment of the present invention includes a conductive polymer (A), a water-soluble polymer (B), and a solvent (C1), which are described below. The conductive composition may, if necessary, further include a basic compound (D), a polymeric compound (E), and optional components, which are described below.

<Conductive Polymer (A)>

Examples of the conductive polymer (A) include polypyrrole, polythiophene, polythiophene vinylene, polytellurophene, polyphenylene, polyphenylene vinylene, polyaniline, polyacene, polyacetylene and the like.

Among these, polypyrrole, polythiophene and polyaniline are preferable from the viewpoint of excellent conductivity.

Specific examples of monomers (raw material monomers) constituting polypyrrole include pyrrole, N-methylpyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxypyrrole, 3-methyl-4-carboxypyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole and the like.

Specific examples of monomers (raw material monomers) constituting polythiophene include thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxythiophene, 3-decyloxythiophene, 3-dodecyloxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4-didodecyloxythiophene, 3,4-ethylenedioxythiophene, 3,4-propylenedioxythiophene, 3,4-butenedioxythiophene, 3-methyl-4-methoxythiophene, 3-methyl-4-ethoxythiophene, 3-carboxythiophene, 3-methyl-4-carboxythiophene, 3-methyl-4-carboxyethylthiophene, 3-methyl-4-carboxybutylthiophene, 6-(2,3-dihydrothieno[3,4-b][1,4]dioxin-2-yl)hexane-1-sulfonic acid, 6-(2,3-dihydro-thieno[3,4-b][1,4]dioxin-2-yl)hexane-1-sulfonic acid sodium salt, 6-(2,3-dihydro-thieno[3,4-b][1,4]dioxin-2-yl)hexane-1-sulfonic acid lithium salt, 6-(2,3-dihydrothieno[3,4-b][1,4]dioxin-2-yl)hexane-1-sulfonic acid potassium salt, 8-(2,3-dihydro-thieno[3,4-b][1,4]dioxin-2-yl)octane-1-sulfonic acid, 8-(2,3-dihydro-thieno[3,4-b][1,4]dioxin-2-yl)octane-1-sulfonic acid sodium salt, 8-(2,3-dihydro-thieno [3,4-b] [1,4]dioxin-2-yl) octane-1-sulfonic acid potassium salt, 3-[(2,3-dihydrothieno[3,4-b]-[1,4]dioxin-2-yl)methoxy]-1-propanesulfonic acid sodium salt, 3-[(2,3-dihydrothieno[3,4-b]-[1,4]dioxin-2-yl)methoxy]-1-propanesulfonic acid potassium salt, 3-[(2,3-dihydrothieno [3,4-b]-[1,4]dioxin-2-yl)methoxy]-1-methyl-1-propanesulfonic acid sodium salt, 3-[(2,3-dihydrothieno[3,4-b]-[1,4]dioxin-2-yl)methoxy]-1-ethyl-1-propanesulfonic acid sodium salt, 3-[(2,3-dihydrothieno[3,4-b]-[1,4]dioxin-2-yl)methoxy]-1-propyl-1-propanesulfonic acid sodium salt, 3-[(2,3-dihydrothieno[3,4-b]-[1,4]dioxin-2-yl)methoxy]-1-butyl-1-propanesulfonic acid sodium salt, 3-[(2,3-dihydrothieno[3,4-b]-[1,4]dioxin-2-yl)methoxy]-1-pentyl-1-propanesulfonic acid sodium salt, 3-[(2,3-dihydrothieno[3,4-b]-[1,4]dioxin-2-yl)methoxy]-1-hexyl-1-propanesulfonic acid sodium salt, 3-[(2,3-dihydrothieno[3,4-b]-[1,4]dioxin-2-yl)methoxy]-1-isopropyl-1-propanesulfonic acid sodium salt, 3-[(2,3-dihydrothieno[3,4-b]-[1,4]dioxin-2-yl)methoxy]-1-isobutyl-1-propanesulfonic acid sodium salt, 3-[(2,3-dihydrothieno[3,4-b]-[1,4]dioxin-2-yl)methoxy]-1-isopentyl-1-propanesulfonic acid sodium salt, 3-[(2,3-dihydrothieno [3,4-b]-[1,4]dioxin-2-yl)methoxy]-1-fluoro-1-propanesulfonic acid sodium salt, 3-[(2,3-dihydrothieno [3,4-b]-[1,4]dioxin-2-yl)methoxy]-1-methyl-1-propane sulfonate potassium salt, 3-[(2,3-dihydrothieno[3,4-b]-[1,4]dioxy-2-yl)methoxy]-1-methyl-1-propanesulfonic acid salt, 3-[(2,3-dihydrothieno[3,4-b]-[1,4] dioxin-2-yl) methoxy]-1-methyl-1-propanesulfonic acid ammonium salt, 3-[(2,3-dihydrothieno [3,4-b]-[1,4]dioxin-2-yl)methoxy]-2-methyl-1-propanesulfonic acid sodium salt, 3-[(2,3-dihydrothieno[3,4-b]-[1,4]dioxin-2-yl)methoxy]-1-methyl-1-propanesulfonic acid triethylammonium salt, 4-[(2,3-dihydrothieno[3,4-b]-[1,4]dioxin-2-yl)methoxy]-1-butanesulfonic acid sodium salt, 4-[(2,3-dihydrothieno[3,4-b]-[1,4]dioxin-2-yl)methoxy]-1-butanesulfonic acid potassium salt, 4-[(2,3-dihydrothieno[3,4-b]-[1,4]dioxin-2-yl)methoxy]-1-methyl-1-butanesulfonic acid sodium salt, 4-[(2,3-dihydrothieno[3,4-b]-[1,4]dioxin-2-yl)methoxy]-1-methyl-1-butanesulfonic acid potassium salt, 4-[(2,3-dihydrothieno[3,4-b]-[1,4]dioxin-2-yl)methoxy]-1-fluoro-1-butanesulfonic acid sodium salt, and 4-[(2,3-dihydrothieno[3,4-b]-[1,4]dioxin-2-yl)methoxy]-1-fluoro-1-butanesulfonic acid potassium salt, and the like.

Specific examples of monomers (raw material monomers) constituting polyaniline include aniline, 2-methylaniline, 3-isobutylaniline, 2-methoxyaniline, 2-ethoxyaniline, 2-anilinesulfonic acid, 3-anilinesulfonic acid and the like.

The conductive polymer (A) preferably has water solubility or water dispersibility. When the conductive polymer (A) has water solubility or water dispersibility, the coatability of the conductive composition is enhanced, and a coating film having a uniform thickness can be easily obtained.

The conductive polymer (A) preferably has an acidic group. When the conductive polymer (A) has an acidic group, the water solubility can be enhanced.

The conductive polymer having an acidic group is not particularly limited as long as the polymer has at least one group selected from the group consisting of a sulfonic acid group and a carboxy group in its molecule and the effects of the present invention can be obtained, and the examples thereof preferable from the viewpoint of solubility include conductive polymers described in Japanese Patent Unexamined Publication Nos. Sho 61-197633, Sho 63-39916, Hei 1-301714, Hei 5-504153, Hei 5-503953, Hei 4-32848, Hei 4-328181, Hei 6-145386, Hei 6-56987, Hei 5-226238, Hei 5-178989, Hei 6-293828, Hei 7-118524, Hei 6-32845, Hei 6-87949, Hei 6-256516, Hei 7-41756, Hei 7-48436, Hei 4-268331, and 2014-65898.

Specific examples of the conductive polymer having an acidic group include π-conjugated conductive polymers containing, as repeating units, at least one type of monomers selected from the group consisting of phenylene vinylene, vinylene, thienylene, pyrrolylene, phenylene, iminophenylene, isothianaphthene, furylene, and carbazolylene, each having its α position or β position substituted with at least one group selected from the group consisting of a sulfonic acid group and a carboxy group.

When the π-conjugated conductive polymer contains at least one repeating unit selected from the group consisting of iminophenylene and carbazolylene, examples thereof include a conductive polymer having at least one group selected from the group consisting of a sulfonic acid group and a carboxy group on the nitrogen atoms of the repeating units, and a conductive polymer having an alkyl group (or an ether bond-containing alkyl group) substituted with at least one group selected from the group consisting of a sulfonic acid group and a carboxy group on the nitrogen atoms of the repeating units.

Among these, from the perspective of conductivity and solubility, it is preferable to use conductive polymers having at least one type of monomer unit selected from the group consisting of thienylene, pyrrolylene, iminophenylene, phenylenevinylene, carbazolylene, and isothianaphthene, each having its β position substituted with at least one group selected from the group consisting of a sulfonic acid group and a carboxy group.

The conductive polymer (A) preferably has at least one type of monomer unit selected from the group consisting of monomer units represented by the following formulae (4) to (7) from the perspective of conductivity and solubility.

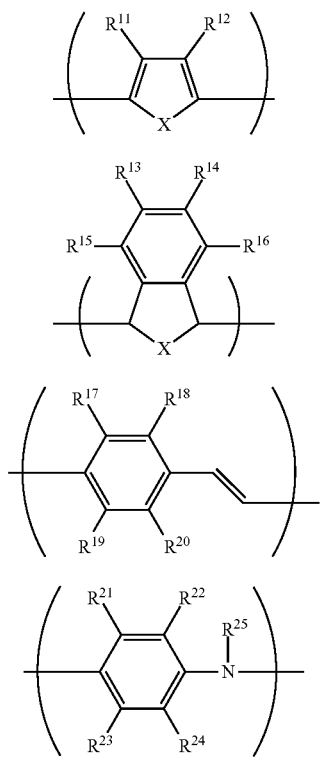

In the formulae (4) to (7), X represents a sulfur atom or a nitrogen atom, and each of $R^{11}$ to $R^{25}$ independently represents a hydrogen atom, a linear or branched alkyl group having 1 to 24 carbon atoms, a linear or branched alkoxy group having 1 to 24 carbon atoms, an acidic group, a hydroxy group, a nitro group, a halogen atom (—F, —Cl —Br or —I), —N($R^{26}$)$_2$, —NHCOR$^{26}$, —SR$^{26}$, —OCOR$^{26}$, —COOR$^{26}$, —COR$^{26}$, —CHO or —CN. $R^{26}$ is preferably an alkyl group having 1 to 24 carbon atoms, an aryl group having 6 to 24 carbon atoms, or an aralkyl group having 7 to 24 carbon atoms.

However, at least one of $R^{11}$ and $R^{12}$ in the formula (4), at least one of $R^{13}$ to $R^{16}$ in the formula (5), at least one of $R^{17}$ to $R^{20}$ in the formula (6), and at least one of $R^{21}$ to $R^{25}$ in the formula (7) are each an acidic group or a salt thereof.

The "acidic group" means a sulfonic acid group (sulfo group) or a carboxylic acid group (carboxy group).

The sulfonic acid group may be present in an acid form (—SO$_3$H) or an ionic form (—SO$_3^-$). Further, the sulfonic acid group also encompasses a substituent having a sulfonic acid group (—R$^{27}$SO$_3$H).

On the other hand, the carboxylic acid group may be present in an acid form (—COOH) or an ionic form (—COO$^-$). Further, the carboxylic acid group also encompasses a substituent having a carboxylic acid group (—R$^{27}$COOH).

$R^{27}$ represents a linear or branched alkylene group having 1 to 24 carbon atoms, a linear or branched arylene group having 6 to 24 carbon atoms, or a linear or branched aralkylene group having 7 to 24 carbon atoms.

Examples of the salt of acidic group include alkali metal salts, alkaline earth metal salts, ammonium salts, and substituted ammonium salts of a sulfonic acid group or a carboxylic acid group.

Examples of the alkali metal salt include lithium sulfate, lithium carbonate, lithium hydroxide, sodium sulfate, sodium carbonate, sodium hydroxide, potassium sulfate, potassium carbonate, potassium hydroxide and derivatives having skeletons thereof.

Examples of the alkaline earth metal salt include magnesium salts, calcium salts and the like.

Examples of the substituted ammonium salt include aliphatic ammonium salts, saturated alicyclic ammonium salts, unsaturated alicyclic ammonium salts and the like.

Examples of the aliphatic ammonium salts include methyl ammonium, dimethyl ammonium, trimethyl ammonium, ethyl ammonium, diethyl ammonium, triethyl ammonium, methyl ethyl ammonium, diethyl methyl ammonium, dimethyl ethyl ammonium, propyl ammonium, dipropyl ammonium, isopropyl ammonium, diisopropyl ammonium, butyl ammonium, dibutyl ammonium, methyl propyl ammonium, ethyl propyl ammonium, methyl isopropyl ammonium, ethyl isopropyl ammonium, methyl butyl ammonium, ethyl butyl ammonium, tetramethyl ammonium, tetramethylol ammonium, tetra ethyl ammonium, tetra n-butyl ammonium, tetra sec-butyl ammonium, tetra t-butyl ammonium, and the like.

Examples of the saturated alicyclic ammonium salts include piperidinium, pyrrolidinium, morpholinium, piperazinium, and derivatives having skeletons thereof.

Examples of the unsaturated alicyclic ammonium salts include pyridinium, α-picolinium, β-picolinium, γ-picolinium, quinolinium, isoquinolinium, pyrrolinium, and derivatives having skeletons thereof.

The conductive polymer (A) preferably has a monomer unit represented by the above formula (7) since high conductivity can be achieved. Among the monomer units represented by the above formula (7), from the perspective of excellent solubility, especially preferred is a monomer unit represented by the following formula (8).

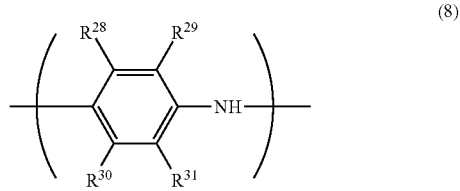

In the formula (8), each of $R^{28}$ to $R^{31}$ independently represents a hydrogen atom, a linear or branched alkyl group having 1 to 24 carbon atoms, a linear or branched alkoxy group having 1 to 24 carbon atoms, an acidic group, a hydroxy group, a nitro group or a halogen atom (—F, —Cl —Br or —I). At least one of $R^{28}$ to $R^{31}$ is an acidic group or a salt thereof.

As for the monomer unit represented by the above formula (8), it is preferable in terms of easy production that any one of $R^{28}$ to $R^{31}$ is a linear or branched alkoxy group having 1 to 4 carbon atoms, while another one of $R^{28}$ to $R^{31}$ is a sulfonic acid group, and the remainder is hydrogen.

In the conductive polymer (A), for achieving very good solubility, the number of acid group-bonded aromatic rings is preferably 50% or more, more preferably 70% or more, still more preferably 90% or more, and most preferably 100%, relative to the total number of aromatic rings present in the polymer.

The number of acid group-bonded aromatic rings relative to the total number of aromatic rings present in the polymer refers to a value calculated from the compounding ratio of monomers at the production of the conductive polymer (A).

Further, with respect to substituents on the aromatic rings of the monomer units in the conductive polymer (A), the substituents other than the acidic group are preferably electron donating groups for imparting reactivity to the monomers. Specifically, the substituents are preferably alkyl groups having 1 to 24 carbon atoms, alkoxy groups having 1 to 24 carbon atoms, halogen groups (—F, —Cl, —Br or —I) and the like, and alkoxy groups having 1 to 24 carbon atoms are most preferable from the perspective of electron donation.

The conductive polymer (A) is preferably a compound having a structure represented by the following formula (9) since high conductivity and solubility can be achieved. Further preferable among the compounds having a structure represented by the formula (9) is a polyaniline having a sulfonic acid group, that is, polyaniline sulfonic acid, and poly(2-sulfo-5-methoxy-1,4-iminophenylene) is particularly preferable.

by GPC. When the weight average molecular weight of the conductive polymer (A) is less than 1000, good solubility may be achieved, but the conductivity and the film formability may be insufficient. On the other hand, when the weight average molecular weight exceeds 1,000,000, good conductivity may be achieved, but the solubility may be insufficient.

The term "film formability" refers to an ability to form a uniform film without cissing etc., which can be evaluated by a method such as spin coating on glass.

As for the method for producing the conductive polymer (A), there is no particular limitation and any known method can be employed as long as the desired effects of the present invention are available.

Specific examples of the method include a method of polymerizing polymerizable monomers (raw material monomers) capable of forming any of the above monomer units by various synthesis methods such as a chemical oxidation method, an electrolytic oxidation method and the like. As such method, for example, the synthesis methods described in Japanese Unexamined Patent Application Publication Nos. Hei 7-196791 and Hei 7-324132 can be adopted.

An example of method for producing the conductive polymer (A) will be described below.

For example, the conductive polymer (A) can be obtained by polymerizing raw material monomers using an oxidizing agent in the presence of a basic reaction auxiliary.

Examples of the basic reaction auxiliary include inorganic bases (e.g., sodium hydroxide, potassium hydroxide, lithium hydroxide, etc.), ammonia, aliphatic amines, cyclic saturated amines, and cyclic unsaturated amines.

Examples of the oxidant include peroxodisulfuric acids (e.g., peroxodisulfuric acid, ammonium peroxodisulfate, sodium peroxodisulfate, potassium peroxodisulfate, etc.), hydrogen peroxide, etc.

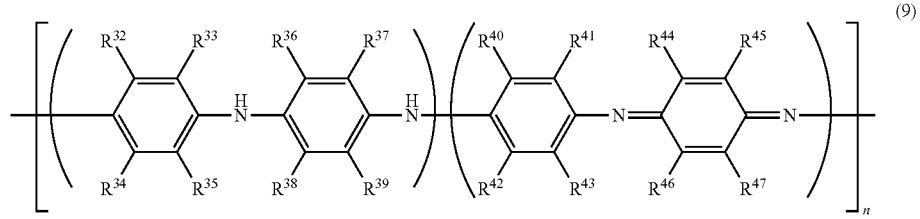

(9)

In the formula (9), each of $R^{32}$ to $R^{47}$ independently represents a hydrogen atom, a linear or branched alkyl group having 1 to 4 carbon atoms, a linear or branched alkoxy group having 1 to 4 carbon atoms, an acidic group, a hydroxy group, a nitro group or a halogen atom (—F, —Cl —Br or —I). At least one of $R^{32}$ to $R^{47}$ is an acidic group or a salt thereof. Further, n represents a polymerization degree. In the present invention, n is preferably an integer of 5 to 2500.

It is desirable that at least a part of the acidic groups contained in the conductive polymer (A) is in a free acid form from the perspective of conductivity improvement.

From the perspective of conductivity, solubility and film formability, the weight average molecular weight of the conductive polymer (A) is preferably 1,000 to 1,000,000, more preferably 1,500 to 800,000, still more preferably 2,000 to 500,000, and particularly preferably 2,000 to 100,000, in terms of sodium polystyrene sulfonate as determined Examples of the polymerization method includes a method of dropping a mixture of raw material monomers and a basic reaction auxiliary into an oxidant solution, a method of dropping an oxidant solution into a mixture of raw material monomers and a basic reaction auxiliary, and a method of dropping a mixture of raw material monomers and a basic reaction auxiliary as well as an oxidant solution into a reaction vessel simultaneously.

After the polymerization, the solvent is usually separated by a separation device such as a centrifugal separator. The conductive polymer (A) is obtained by drying the filtered material after washing it with a washing solution if necessary.

The conductive polymer (A) obtained in this manner may contain low molecular weight materials such as raw material monomers (unreacted monomers), oligomers formed by side reactions, the oxidant, and the basic reaction auxiliary. These low molecular weight materials inhibit the conductivity.

Therefore, it is preferable to purify the conductive polymer (A) to remove the low molecular weight materials.

The method for purifying the conductive polymer (A) is not particularly limited, any purification methods can be employed, such as ion exchange method, acid cleaning in a protonic acid solution, removal by heat treatment, and neutralization and precipitation; however, the ion exchange method is particularly effective because a highly-purified conductive polymer (A) can obtained with ease.

Examples of the ion exchange method include column or batch treatments using ion exchange resins such as cation exchange resins and anion exchange resins; electrodialysis methods, etc.

When the conductive polymer (A) is purified by the ion exchange method, it is preferable to dissolve a reaction mixture obtained by the polymerization in an aqueous medium to a desired solids concentration, and then allow the resulting polymer solution to contact an ion exchange resin.

The aqueous media may be water, an organic solvent, or a solvent mixture of water and an organic solvent. The organic solvent may be the same as the solvent (C1) described below.

The concentration of the conductive polymer (A) in the polymer solution is preferably 0.1 to 20% by mass, and more preferably 0.1 to 10% by mass from the viewpoint of industrial efficiency and purification efficiency.

The amount of the conductive polymer (A), based on a total mass of the conductive composition, is preferably 0.1 to 5% by mass, more preferably 0.2 to 3% by mass, and even more preferably 0.5 to 2% by mass.

The amount of the conductive polymer (A), based on a total mass of solid components of the conductive composition, is preferably 50 to 99.9% by mass, more preferably 80 to 99.9% by mass, and even more preferably 95 to 99.9% by mass. The solid components of the conductive composition are a residue obtained by removing the solvent (C1) from the conductive composition.

When the amount of the conductive polymer (A) is within the range described above, an excellent balance is achieved between the coatability of the conductive composition and the conductivity of a coating film formed from the conductive composition.

<Water-Soluble Polymer (B)>

The water-soluble polymer (B) includes a water-soluble polymer (B11) shown below and, optionally, a water-soluble polymer (B2) shown below.

In this context, the term "optionally" means that the water-soluble polymer (B) may or may not contain the water-soluble polymer (B2). In other words, the water-soluble polymer (B) may contain the water-soluble polymer (B11) while being substantially free of the water-soluble polymer (B2), or may be a mixture of the water-soluble polymer (B11) and the water-soluble polymer (B2).

As described later in detail, the water-soluble polymer (B) is obtained by polymerizing the water-soluble vinyl monomers in a specific solvent in the presence of a polymerization initiator having a terminal hydrophobic group.

The water/octanol partition coefficient (Log P) for polymerization initiator-derived components in the water-soluble polymer (B) is preferably 8.50 or more, and more preferably 9.0 to 20.0. When the water/octanol partition coefficient for polymerization initiator-derived components is not less than the lower limit value described above, the surface activity is more likely to be exhibited.

(Water-Soluble Polymer (B11))

The water-soluble polymer (B11) is a compound represented by the following formula (11).

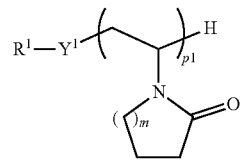

(11)

In the formula (11), $R^1$ denotes a linear or branched alkyl group with 6 to 20 carbon atoms, $Y^1$ denotes a single bond, —S—, —S(=O)—, —C(=O)—O— or —O—, p1 denotes an average number of repetitions and is a number of from 1 to 50, and m denotes a number of from 1 to 5.

$R^1$ is a hydrophobic substituent. In other words, the water-soluble polymer (B11) is a compound having a terminal hydrophobic group and a hydrophilic groups within its molecule, and is likely to exhibit surface activity. Therefore, the presence of the water-soluble polymer (B11) in the conductive composition improve the coatability the coating composition on a substrate and the like. Moreover, while conventional surfactants (e.g., dodecylbenzene sulfonic acid) may have an adverse effect on the resist characteristics, such an adverse effect on the resist characteristics can be easily suppressed by the use of the water-soluble polymer (B11).

Examples of the alkyl group as $R^1$ include a hexyl group, a cyclohexyl group, a 2-ethylhexyl group, a n-octyl group, a lauryl group, a dodecyl group, a tridecyl group, a stearyl group, an isobornyl group, and the like.

In the formula (11), p1 is a number of from 1 to 50, preferably 2 or more, and more preferably 4 or more. Further, p1 is preferably 30 or less, and more preferably 20 or less. Particularly when p1 is greater than or equal to 2, the surface activity is further improved.

The value of p1 can be controlled by adjusting the ratio (molar ratio) of the polymerization initiator used for the polymerization of the water-soluble polymer (B) to the water-soluble vinyl monomer.

The weight average molecular weight of the water-soluble polymer (B11) is preferably 100 to 1,000,000, more preferably 100 to 100,000, even more preferably 600 or more and less than 20,000, and particularly preferably 600 or more and less than 10,000, in terms of polyethylene glycol in GPC. When the weight average molecular weight of the water-soluble polymer (B11) is not less than the lower limit value described above, the effect of improving the coatability of the conductive composition can be more easily achieved. On the other hand, when the weight average molecular weight of the water-soluble polymer (B11) is not more than the upper limit value described above, the water solubility of the conductive composition is enhanced. In particular, when the weight average molecular weight of the water-soluble polymer (B11) is 600 or more and less than 10000, an excellent balance is achieved between the practical solubility thereof in water and the coatability of the conductive composition.

The amount of the water-soluble polymer (B11), based on a total mass of the conductive composition, is preferably 0.001 to 2% by mass, more preferably 0.001 to 0.5% by mass, and even more preferably 0.001 to 0.3% by mass.

Further, the amount of the water-soluble polymer (B11), based on a total mass of solid components of the conductive composition, is preferably 0.1 to 60% by mass, more preferably 0.1 to 50% by mass, and even more preferably 0.1 to 40% by mass.

When the amount of the water-soluble polymer (B11) is within the range described above, an excellent balance is achieved between the coatability of the conductive composition and the conductivity of a coating film formed from the conductive composition.

(Water-Soluble Polymer (B2))

The water-soluble polymer (B2) is a compound represented by the following formula (2).

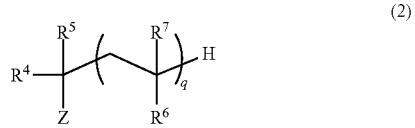

In the formula (2), each of $R^4$ and $R^5$ independently denotes a methyl or ethyl group, $R^6$ denotes a hydrophilic group, $R^7$ denotes a hydrogen atom or a methyl group, Z denotes a cyano group or a hydroxy group, and q denotes an average number of repetitions and is a number of from 1 to 50.

$R^6$ is a hydrophilic group. The hydrophilic group is derived from the water-soluble vinyl monomer, which is the raw material monomer of the water-soluble polymer (B11).

In this context, the "water-soluble vinyl monomer" refers to a vinyl monomer that can be mixed with water at a certain ratio. Examples of the water-soluble vinyl monomer that is the raw material monomer of the water-soluble polymer (B11) include N-vinyl pyrrolidone, N-vinyl piperidinone, N-vinyl caprolactam, N-vinyl-2-azacyclooctanone, N-vinyl-2-azacycuronanone, and the like.

The amount of the water-soluble polymer (B2) in the water-soluble polymer (B), based on a total mass of the conductive composition, is 0.15% by mass or less, i.e., 0 to 0.15% by mass, preferably 0 to 0.1% by mass, more preferably 0 to 0.05% by mass, and it is even more preferable that the water-soluble polymer (B) is substantially free of the water-soluble polymer (B2). In this context, the term "substantially free" means that the amount of the water-soluble polymer (B2), based on the total mass of the conductive composition, is less than 0.005% by mass. In other words, the amount of the water-soluble polymer (B2) in the water-soluble polymer (B) is preferably 0% by mass or more and less than 0.005% by mass, based on the total mass of the conductive composition.

When the amount of the water-soluble polymer (B2) is within the range described above, an excellent balance is achieved between the coatability of the conductive composition and the conductivity of the coating film.

The amount of the water-soluble polymer (B2) in the water-soluble polymer (B), based on a total mass of solid components of the conductive composition, is preferably 7% by mass or less, i.e., 0 to 7% by mass, more preferably 0 to 1% by mass, and it is even more preferable that the water-soluble polymer (B) is substantially free of the water-soluble polymer (B2). In this context, the term "substantially free" means that the amount of the water-soluble polymer (B2), based on the total mass of solid components of the conductive composition, is less than 0.1% by mass. In other words, the amount of the water-soluble polymer (B2) in the water-soluble polymer (B) is preferably 0% by mass or more and less than 0.1% by mass, based on the total mass of solid components of the conductive composition.

When the amount of the water-soluble polymer (B2) is within the range described above, an excellent balance is achieved between the coatability of the conductive composition and the conductivity of the coating film.

<Solvent (C1)>

The solvent (C1) is not particularly limited as long as it can dissolve the conductive polymer (A) and the water-soluble polymer (B) and the effects of the present invention can be obtained, and examples thereof include water and a mixed solvent of water and an organic solvent.

Examples of the organic solvent include alcohols such as methanol, ethanol, isopropyl alcohol, propyl alcohol and butanol; ketones such as acetone and ethyl isobutyl ketone; ethylene glycols such as ethylene glycol and ethylene glycol methyl ether; propylene glycols such as propylene glycol, propylene glycol methyl ether, propylene glycol ethyl ether, propylene glycol butyl ether and propylene glycol propyl ether; amides such as dimethylformamide and dimethylacetamide; and pyrrolidones such as N-methylpyrrolidone and N-ethylpyrrolidone.

When a mixed solvent of water and an organic solvent is used as the solvent (C1), the mass ratio of water to an organic solvent (water/organic solvent) is preferably 1/100 to 100/1, and more preferably 2/100 to 100/2.

The amount of the solvent (C1) is preferably 1 to 99% by mass, more preferably 10 to 98% by mass, and even more preferably 50 to 98% by mass, based on a total mass of the conductive composition.

When the amount of the solvent (C1) is within the range described above, the coatability further improves.

<Basic Compound (D)>

If necessary, a basic compound (D) may be added to the conductive composition. When the conductive polymer (A) has an acidic group, the basic compound (D) serves to generate a salt with the acidic group to neutralize the acidic group. By neutralization, the influence on the resist can be suppressed.

The basic compound (D) is not particularly limited, but when the conductive polymer (A) has an acidic group, the basic compound (D) preferably includes at least one selected from the group consisting of a quaternary ammonium salt (d-1), a basic compound (d-2), and a basic compound (d-3), which are described below, because the formation of a salt with the acidic group is facilitated, thereby stabilizing the acidic group to achieve excellent effect of preventing acidic substances derived from the film from affecting the resist pattern.

Quaternary ammonium salt (d-1): a quaternary ammonium compound in which at least one of the four substituents bonded to the nitrogen atom is a hydrocarbon group having 1 or more carbon atoms.

Basic compound (d-2): a basic compound having one or more nitrogen atoms (exclusive of the quaternary ammonium salt (d-1) and the basic compound (d-3)).

Basic compound (d-3): a basic compound having a basic group and two or more hydroxy groups in the same molecule and a melting point of 30° C. or higher.

In the quaternary ammonium compound (d-1), the nitrogen atom to which the four substituents are bonded is a nitrogen atom of the quaternary ammonium ion.

Examples of the hydrocarbon group bonded to the nitrogen atom of the quaternary ammonium ion in the compound (d-1) include an alkyl group, an aralkyl group and an aryl group.

Examples of the quaternary ammonium compound (d-1) include tetrapropylammonium hydroxide, tetrabutylammonium hydroxide, tetrapentylammonium hydroxide, tetrahexylammonium hydroxide, benzyltrimethylammonium hydroxide and the like.

Examples of the basic compound (d-2) includes ammonia, pyridine, triethylamine, 4-dimethylaminopyridine, 4-dimethylaminomethylpyridine, 3,4-bis(dimethylamino)pyridine, 4-hydroxypyridine, 4-methylpyridine, 1,5-diazabicyclo[4.3.0]-5-nonene (DBN), 1,8-diazabicyclo[5.4.0]-7-undecene (DBU), and derivatives thereof.

In the basic compound (d-3), the basic group may be, for example, a basic group defined as an Arrhenius base, a Brønsted base, a Lewis base, etc. Specific examples include ammonia, etc. The hydroxy group may be in the state of —OH or may be protected by a protective group. Examples of the protective groups include an acetyl group; a silyl group such as a trimethyl silyl group, a tert-butyl dimethyl silyl group, etc.; an acetal-type protective group such as a methoxymethyl group, an ethoxymethyl group, a methoxyethoxymethyl group, etc.; a benzoyl group; an alkoxide group, etc.

Examples of the basic compound (d-3) includes 2-amino-1,3-propanediol, tris(hydroxymethyl)aminomethane, 2-amino-2-methyl-1,3-propanediol, 2-amino-2-ethyl-1,3-propanediol, 3-[N-tris(hydroxymethyl)methylamino]-2-hydroxypropanesulfonic acid, and N-tris(hydroxymethyl)methyl-2-aminoethanesulfonic acid.

One of these basic compounds may be used alone, or two or more of them may be used in the form of a mixture thereof with an appropriate blending ratio.

In particular, since it is easier to form a salt with the acidic group of the conductive polymer (A), it is preferable that the basic compound (D) includes at least one species selected from the group consisting of the quaternary ammonium salt (d-1) and the basic compound (d-2).

As the basic compound (D), basic compounds other than the quaternary ammonium compound (d-1), the basic compound (d-2) and the basic compound (d-3) may also be mixed.

The amount of the basic compound (D) is preferably 0.1 to 70% by mass, and more preferably 0.1 to 50% by mass, based on a total mass of solid components of the conductive composition.

When the amount of the basic compound (D) is within the range described above, an excellent balance is achieved between the coatability of the conductive composition and the conductivity of a coating film formed from the conductive composition. In particular, when the amount of the basic compound (D) is not less than the lower limit value described above, a coating film with less influence on the resist pattern can be formed.

<Polymeric Compound (E)>

The conductive composition may include a polymer compound (E), if necessary, for the purpose of further improving the strength and surface smoothness of the coating film.

Specific examples of the polymer compound (E) include polyvinyl alcohol derivatives such as polyvinyl formal and polyvinyl butyral, polyacrylamides such as polyacrylamide, poly(N-t-butyl acrylamide) and polyacrylamide methyl propane sulfonate, polyvinyl pyrrolidones, polyacrylic acids, water-soluble alkyd resins, water-soluble melamine resins, water-soluble urea resins, water-soluble phenol resins, water-soluble epoxy resins, water-soluble polybutadiene resins, water-soluble acrylic resins, water-soluble urethane resins, water-soluble acrylic styrene copolymer resins, water-soluble vinyl acetate acrylic copolymer resins, and water-soluble polyester resins, water-soluble styrene maleic acid copolymer resins, water-soluble fluoro resins, and copolymers thereof.

<Optional Component>

Further, the conductive composition may optionally contain any of various additives, such as a pigment, an antifoaming agent, an ultraviolet light absorber, an antioxidant, a heat resistance improver, a leveling agent, an antidripping agent, a matting agent, and a preservative.

In the present invention, the sum of amounts of the conductive polymer (A), the water-soluble polymer (B), and the solvent (C1) in the conductive composition of the first embodiment of the invention does not exceed 100% by mass of the total mass of the conductive composition. When the conductive composition contains at least one of the basic compound (D), the polymeric compound (E), and the optional component, the sum of the amounts of the conductive polymer (A), the water-soluble polymer (B), the solvent (C1), the basic compound (D), the polymeric compound (E), and the optional component in the conductive composition does not exceed 100% by mass of the total mass of the conductive composition.

Further, the amounts of all components of the conductive composition add up to 100% by mass.

Effects

As described later in detail, the water-soluble polymer (B) can be obtained by polymerizing the water-soluble vinyl monomers. As a result of intensive studies, the present inventors have found out that the water-soluble polymer (B2) may be generated during the production of the water-soluble polymer (B) in addition to the water-soluble polymer (B11) which is the target product, and the water-soluble polymer (B) is obtained in the form of a mixture of the water-soluble polymer (B11) and the water-soluble polymer (B2). Therefore, when the water-soluble polymer (B) is used for production of a conductive composition, the water-soluble polymer (B2) is also unintentionally allowed to be mixed in the conductive composition. The present inventors made a study on the water-soluble polymer (B2) and found that the water-soluble polymer (B2) has a low surface activity. Therefore, when the produced water-soluble polymer (B) is used in a conductive composition without removing the water-soluble polymer (B2), a large amount of the water-soluble polymer (B) must be blended in order to achieve sufficient surface activity. If the water-soluble polymer (B2) is removed from the water-soluble polymer (B), even a small amount of the water-soluble polymer (B) enables a sufficient surface activity. However, for example, the purification by the reprecipitation method cannot easily separate the water-soluble polymer (B11) from the water-soluble polymer (B2), and requires cumbersome operation to remove the water-soluble polymer (B2).

The conductive composition of the first embodiment of the invention contains the conductive polymer (A), the water-soluble polymer (B11), and the solvent (C1), which are described above, and the amount of the water-soluble polymer (B2) is specified as 0.15% by mass or less, based on the total mass of the conductive composition. This means that, even when the water-soluble polymer (B) obtained by polymerizing the water-soluble vinyl monomers is used as it is in a conductive composition without purification treatment to intentionally remove the water-soluble polymer (B2), the amount of the water-soluble polymer (B2) is sufficiently reduced. In other words, it means that the generation of the water-soluble polymer (B2) is suppressed during the production of the water-soluble polymer (B). Therefore, even if the water-soluble polymer (B) is used without purification treatment to intentionally remove the water-soluble polymer (B2), a sufficient surface activity can be achieved with only a small amount of the water-soluble polymer (B). Further, since the amount of the water-soluble polymer (B) can be reduced, the proportion of the conductive polymer (A) to the total mass of solid components of the conductive composition increases relatively and the conductivity of the coating film improves.

Second Embodiment

The conductive composition of the second embodiment of the present invention includes a conductive polymer (A), a water-soluble polymer (B), a solvent (C1), and a basic compound (D) which are described below. The conductive composition may, if necessary, further include a polymeric compound (E), and optional components, which are described below.

The explanations on the conductive polymer (A), the solvent (C1) and the basic compound (D) in the conductive composition of the second embodiment of the present invention are omitted, because these are the same as the conductive polymer (A), the solvent (C1) and the basic compound (D) described above in the explanations on the conductive composition of the first embodiment of the present invention.

Likewise, the explanations on the polymeric compound (E) and the optional components that may, if necessary, be contained in the conductive composition of the second embodiment of the present invention are omitted, because these are the same as the polymeric compound (E) and the optional components described above in the explanations on the conductive composition of the first embodiment of the present invention.

<Water-Soluble Polymer (B)>

The water-soluble polymer (B) includes a water-soluble polymer (B1) shown below and, optionally, a water-soluble polymer (B2) shown below.

In this context, the term "optionally" means that the water-soluble polymer (B) may or may not contain the water-soluble polymer (B2). In other words, the water-soluble polymer (B) may contain the water-soluble polymer (B1) while being substantially free of the water-soluble polymer (B2), or may be a mixture of the water-soluble polymer (B1) and the water-soluble polymer (B2).

As described later in detail, the water-soluble polymer (B) is obtained by polymerizing the water-soluble vinyl monomers in a specific solvent in the presence of a polymerization initiator having a terminal hydrophobic group.

The water/octanol partition coefficient (Log P) for polymerization initiator-derived components in the water-soluble polymer (B) is preferably 8.50 or more, and more preferably 9.0 to 20.0. When the water/octanol partition coefficient for polymerization initiator-derived components is not less than the lower limit value described above, the surface activity is more likely to be exhibited.

(Water-Soluble Polymer (B1))

The water-soluble polymer (B1) is a compound represented by the following formula (1).

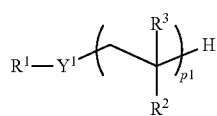

(1)

In the formula (1), $R^1$ denotes a linear or branched alkyl group with 6 to 20 carbon atoms, $R^2$ denotes a hydrophilic group, $R^3$ denotes a hydrogen atom or a methyl group, $Y^1$ denotes a single bond, —S—, —S(=O)—, —C(=O)—O— or —O—, and p1 denotes an average number of repetitions and is a number of from 1 to 50.

$R^1$ is a hydrophobic substituent. In other words, the water-soluble polymer (B1) is a compound having a terminal hydrophobic group and a hydrophilic groups within its molecule, and is likely to exhibit surface activity. Therefore, the presence of the water-soluble polymer (B1) in the conductive composition improves the coatability of the coating composition on a substrate and the like. Moreover, while conventional surfactants (e.g., dodecylbenzene sulfonic acid) may have an adverse effect on the resist characteristics, such an adverse effect on the resist characteristics can be easily suppressed by the use of the water-soluble polymers (B1).

Examples of the alkyl group as $R^1$ include a hexyl group, a cyclohexyl group, a 2-ethylhexyl group, a n-octyl group, a lauryl group, a dodecyl group, a tridecyl group, a stearyl group, an isobornyl group, and the like.

$R^2$ is a hydrophilic group. The hydrophilic group is derived from the water-soluble vinyl monomer, which is the raw material monomer of the water-soluble polymer (B1).

In this context, the "water-soluble vinyl monomer" refers to a vinyl monomer that can be mixed with water at a certain ratio. Examples of the water-soluble vinyl monomer that is the raw material monomer of the water-soluble polymer (B1) include N-vinylpyrrolidone, 2-hydroxyethyl (meth) acrylate, (meth)acrylamide, N,N-dimethylacrylamide, acryloyl morpholine, and N-vinylformamide.

In the formula (11), p1 is a number of from 1 to 50, preferably 2 or more, and more preferably 4 or more. Further, p1 is preferably 30 or less, and more preferably 20 or less. Particularly when p1 is greater than or equal to 2, the surface activity is further improved.

The value of p1 can be controlled by adjusting the ratio (molar ratio) of the polymerization initiator used for the polymerization of the water-soluble polymer (B) to the water-soluble vinyl monomer.

The weight average molecular weight of the water-soluble polymer (B1) is preferably 100 to 1,000,000, more preferably 100 to 100,000, and particularly preferably 600 or more and less than 10,000, in terms of polyethylene glycol in GPC. When the weight average molecular weight of the water-soluble polymer (B1) is not less than the lower limit value described above, the effect of improving the coatability of the conductive composition can be more easily achieved. On the other hand, when the weight average molecular weight of the water-soluble polymer (B1) is not more than the upper limit value described above, the water solubility of the conductive composition is enhanced. In particular, when the weight average molecular weight of the water-soluble polymer (B1) is 600 or more and less than 2000, an excellent balance is achieved between the practical solubility thereof in water and the coatability of the conductive composition.

The water-soluble polymer (B1) is preferably the water-soluble polymer (B11) represented by the formula (11) described above in the explanations on the conductive composition of the first embodiment of the present invention from the perspective of solubility and the like.

The amount of the water-soluble polymer (B1), based on a total mass of the conductive composition, is preferably 0.001 to 1% by mass, more preferably 0.001 to 0.3% by mass, and even more preferably 0.01 to 0.1% by mass.

Further, the amount of the water-soluble polymer (B1), based on a total mass of solid components of the conductive composition, is preferably 0.1 to 20% by mass, more preferably 0.1 to 5% by mass, and even more preferably 0.1 to 2% by mass.

When the amount of the water-soluble polymer (B1) is within the range described above, an excellent balance is achieved between the coatability of the conductive composition and the conductivity of a coating film formed from the conductive composition.

(Water-Soluble Polymer (B2))

The water-soluble polymer (B2) is a compound represented by the following formula (2).

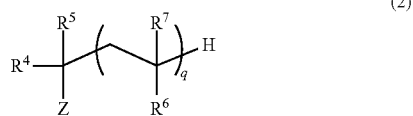

(2)

In the formula (2), each of $R^4$ and $R^5$ independently denotes a methyl or ethyl group, $R^6$ denotes a hydrophilic group, $R^7$ denotes a hydrogen atom or a methyl group, Z denotes a cyano group or a hydroxy group, and q denotes an average number of repetitions and is a number of from 1 to 50.

$R^6$ is a hydrophilic group. The hydrophilic group is derived from the water-soluble vinyl monomer, which is the raw material monomer of the water-soluble polymer (B1). As examples of the water-soluble vinyl monomer, those mentioned above in the explanation on the water-soluble polymer (B1) can be listed.

The amount of the water-soluble polymer (B2) in the water-soluble polymer (B), based on a total mass of the conductive composition, is 0.15% by mass or less, i.e., 0 to 0.15% by mass, preferably 0 to 0.1% by mass, more preferably 0 to 0.05% by mass, and it is even more preferable that the water-soluble polymer (B) is substantially free of the water-soluble polymer (B2). In this context, the term "substantially free" means that the amount of the water-soluble polymer (B2), based on the total mass of the conductive composition, is less than 0.005% by mass. In other words, the amount of the water-soluble polymer (B2) in the water-soluble polymer (B) is preferably 0% by mass or more and less than 0.005% by mass, based on the total mass of the conductive composition.

When the amount of the water-soluble polymer (B2) is within the range described above, an excellent balance is achieved between the coatability of the conductive composition and the conductivity of the coating film.

The amount of the water-soluble polymer (B2) in the water-soluble polymer (B), based on a total mass of solid components of the conductive composition, is preferably 7% by mass or less, i.e., 0 to 7% by mass, more preferably 0 to 1% by mass, and it is even more preferable that the water-soluble polymer (B) is substantially free of the water-soluble polymer (B2). In this context, the term "substantially free" means that the amount of the water-soluble polymer (B2), based on the total mass of solid components of the conductive composition, is less than 0.1% by mass. In other words, the amount of the water-soluble polymer (B2) in the water-soluble polymer (B) is preferably 0% by mass or more and less than 0.1% by mass, based on the total mass of solid components of the conductive composition.

When the amount of the water-soluble polymer (B2) is within the range described above, an excellent balance is achieved between the coatability of the conductive composition and the conductivity of the coating film.

In the present invention, the sum of amounts of the conductive polymer (A), the water-soluble polymer (B), the solvent (C1) and the basic compound (D) in the conductive composition of the second embodiment of the invention does not exceed 100% by mass of the total mass of the conductive composition. When the conductive composition contains at least one of the polymeric compound (E), and the optional component, the sum of the amounts of the conductive polymer (A), the water-soluble polymer (B), the solvent (C1), the basic compound (D), the polymeric compound (E), and the optional component in the conductive composition does not exceed 100% by mass of the total mass of the conductive composition.

Further, the amounts of all components of the conductive composition add up to 100% by mass.

Effects

As described later in detail, the water-soluble polymer (B) can be obtained by polymerizing the water-soluble vinyl monomers. As a result of intensive studies, the present inventors have found out that the water-soluble polymer (B2) may be generated during the production of the water-soluble polymer (B) in addition to the water-soluble polymer (B1) which is the target product, and the water-soluble polymer (B) is obtained in the form of a mixture of the water-soluble polymer (B1) and the water-soluble polymer (B2). Therefore, when the water-soluble polymer (B) is used for production of a conductive composition, the water-soluble polymer (B2) is also unintentionally allowed to be mixed in the conductive composition. The present inventors made a study on the water-soluble polymer (B2) and found that the water-soluble polymer (B2) has a low surface activity. Therefore, when the produced water-soluble polymer (B) is used in a conductive composition without removing the water-soluble polymer (B2), a large amount of the water-soluble polymer (B) must be blended in order to achieve sufficient surface activity. If the water-soluble polymer (B2) is removed from the water-soluble polymer (B), even a small amount of the water-soluble polymer (B) enables a sufficient surface activity. However, for example, the purification by the reprecipitation method cannot easily separate the water-soluble polymer (B1) from the water-soluble polymer (B2), and requires cumbersome operation to remove the water-soluble polymer (B2).

The conductive composition of the second embodiment of the invention contains the conductive polymer (A), the water-soluble polymer (B1), the solvent (C1), and the basic compound (D), which are described above, and the amount of the water-soluble polymer (B2) is specified as 0.15% by mass or less, based on the total mass of the conductive composition. This means that, even when the water-soluble polymer (B) obtained by polymerizing the water-soluble vinyl monomers is used as it is in a conductive composition without purification treatment to intentionally remove the water-soluble polymer (B2), the amount of the water-soluble polymer (B2) is sufficiently reduced. In other words, it means that the generation of the water-soluble polymer (B2) is suppressed during the production of the water-soluble polymer (B). Therefore, even if the water-soluble polymer (B) is used without purification treatment to intentionally remove the water-soluble polymer (B2), a sufficient surface activity can be achieved with only a small amount of the water-soluble polymer (B). Further, since the amount of the water-soluble polymer (B) can be reduced, the proportion of the conductive polymer (A) to the total mass of solid components of the conductive composition increases relatively and the conductivity of the coating film improves.

[Method for Producing Water-Soluble Polymer]

The third embodiment of the present invention relates to a method for producing a water-soluble polymer, i.e., a method for producing the aforementioned water-soluble polymer (B) including the water-soluble polymer (B1), which includes a polymerization step of polymerizing a water-soluble vinyl monomer in a solvent (C2) in the presence of a polymerization initiator having a terminal hydrophobic group.

The polymerization step may be performed in the presence of a chain transfer agent having a terminal hydrophobic group.

As examples of the water-soluble vinyl monomer used in the polymerization step, those mentioned above in the explanations on the water-soluble polymer (B1) can be listed. For example, when N-vinyl pyrrolidone is used as the water-soluble vinyl monomer, a water-soluble polymer (B) including the aforementioned water-soluble polymer (B11) (wherein m in the formula (11) is 1) as the water-soluble polymer (B1) can be obtained.

<Solvent (C2)>

The solvent (C2) used in the polymerization step is a solvent that satisfies the condition 1 below.

Condition 1: a chain transfer constant of methyl acrylate to the solvent (C2) at 50° C. is 0.001 or less.

Examples of the solvent (C2) include ethyl acetate, methyl isobutyl ketone, acetone, methanol, ethanol, butanol, toluene, butyl acetate, and methyl ethyl ketone. One of these may be used alone, or two or more of these may be used in combination.

In the present invention, a solvent (C3) that does not meet the condition 1 may be used together with the solvent (C2) in the polymerization step as long as the effect of the invention is not impaired.

The solvent (C3) is a solvent with a chain transfer constant of methyl acrylate thereto at 50° C. exceeding 0.001. Examples of such a solvent (C3) include isopropyl alcohol, diphenylamine, N,N-dimethylaniline, triethylamine, tributylphosphine, nitrotoluene, nitroaniline, nitrobenzene, nitrophenol, and the like.

When the solvent (C2) and the solvent (C3) are used together, the volume ratio of the solvent (C2) to the solvent (C3), i.e., solvent (C2):solvent (C3), is preferably 1:0.01 to 1:1, more preferably 1:0.05 to 1:0.8, and more preferably 1:0.1 to 1:0.5.

<Polymerization Initiator>

The polymerization initiator used in the polymerization step has a terminal hydrophobic group. Examples of the polymerization initiator include those having a linear or branched chain alkyl group having 6 to 20 carbon atoms and not having a cyano group or a hydroxy group, and more specific examples include dilauroyl peroxide, 1,1,3,3-tetramethylbutyl hydroperoxide, di-tert-hexyl peroxide, di-(2-ethylhexyl)peroxydicarbonate, 1,1,3,3-tetramethylbutyl peroxyneodecanoate, di(3,5,5-trimethylhexanoyl) peroxide, and the like.

One of these may be used alone, or two or more of these may be used in combination.

As mentioned above, the value of p1 in the formula (1) described above and the formula (11) described above can be controlled by adjusting the ratio (molar ratio) of the polymerization initiator and the water-soluble vinyl monomer. The ratio of the polymerization initiator to the water-soluble vinyl monomer is not particularly limited as long as the value of p1 is in the range of 1 to 50. For example, the molar ratio, polymerization initiator:water-soluble vinyl monomer, is preferably 0.001:1 to 0.5:1, and more preferably 0.01:1 to 0.1:1.

<Chain Transfer Agent>

The chain transfer agent used in the polymerization step has a terminal hydrophobic group. Examples of such a chain transfer agent include those having a linear or branched chain alkyl group having 6 to 20 carbon atoms and not having a cyano group or a hydroxy group, and more specific examples include n-dodecyl mercaptan, tert-dodecyl mercaptan, n-octyl mercaptan, 2-ethylhexyl mercaptan, n-octadecyl mercaptan, etc.

One of these may be used alone, or two or more of these may be used in combination.

The ratio of the chain transfer agent to the water-soluble vinyl monomer is not particularly limited. For example, the molar ratio, chain transfer agent:water-soluble vinyl monomer, is preferably 0.001:1 to 0.1:1, and more preferably 0.01:1 to 0.05:1.

<Polymerization Conditions>

The polymerization temperature in the polymerization step is preferably 50 to 200° C., and more preferably 60 to 150° C. The polymerization time is preferably 1 to 10 hours, and more preferably 3 to 8 hours.

After the polymerization reaction, the polymer (B) is obtained by removing the solvent (C2). The obtained polymer (B) may be subjected to a treatment in which the polymer (B) is dissolved in a good solvent to make a water-soluble polymer solution, and the water-soluble polymer solution is added to a poor solvent to produce a precipitate, which is then filtered, washed and dried. Such a treatment yields the water-soluble polymer (B) in solid form.

Effects

As mentioned above, the water-soluble polymer (B2) may be formed during the production of the water-soluble polymer (B). As a result of further intensive studies, the present inventors have found out that $R^1$ and $Y^1$ in the formula (1) and the formula (11) as well as $R^4$, $R^5$ and Z in the formula (2) are derived from the polymerization initiator and the chain transfer agent used in the production of the water-soluble polymer. The present inventors have also found out that some types of solvents used during the polymerization can also act as a chain transfer agent and can be the sources of $R^1$, $Y^1$, $R^4$, $R^5$ and Z.

According to the water-soluble polymer production method of the third embodiment of the present invention, the water-soluble vinyl monomers are polymerized using the specific solvent (C2) and the specific polymerization initiator, thereby allowing the water-soluble polymer (B1) to be preferentially produced while suppressing the formation of the water-soluble polymer (B2).

For example, azo-based polymerization initiators, such as azobisisobutyronitrile and azobismethylbutyronitrile, generally used as polymerization initiators are polymerization initiators having a hydrophilic group such as a cyano group. Therefore, for example, when azobisisomethylbutyronitrile is used as the polymerization initiator, the resulting water-soluble polymer (B2) has an ethyl group as $R^4$ in the formula (2), a methyl group as $R^5$, and a cyano group as Z.

When the water-soluble vinyl monomers are polymerized in the presence of a chain transfer agent having a terminal hydrophobic group and azobisisobutyronitrile, the water-soluble polymer (B) is obtained in the form of a mixture of the water-soluble polymer (B1) and the water-soluble polymer (B2).

As for a solvent, the solvent (C3), which does not satisfy the condition 1 above, tends to show its function as a chain transfer agent. Therefore, for example, when isopropyl alcohol, which is generally used in the polymerization reaction, is used as the solvent (C3), a chain transfer reaction occurs to produce a water-soluble polymer (B2) in which $R^4$ and $R^5$ in the formula (2) are methyl groups and Z is a hydroxy group.

When the water-soluble vinyl monomers are polymerized in isopropyl alcohol in the presence of a polymerization initiator having a terminal hydrophobic group, the water-soluble polymer (B) is obtained in the form of a mixture of the water-soluble polymer (B1) and the water-soluble polymer (B2).

Therefore, although the solvent (C2) and solvent (C3) may be used together in the polymerization step, it is preferable to use only the solvent (C2).

[Method for Producing Conductive Composition]

The fourth embodiment of the present invention relates to a method for producing a conductive composition, which includes a step of producing a water-soluble polymer (B) by the method of the third embodiment of the invention described above, and a step of mixing the obtained water-soluble polymer (B) with the conductive polymer (A) and the solvent (C1) (mixing step).

In the mixing step, it is preferable that the conductive polymer (A), the water-soluble polymer (B) and the solvent (C1) are mixed such that the respective amounts thereof fall within the ranges described in the explanations on the conductive compositions of the first embodiment of the present invention or the conductive composition of the second embodiment of the present invention. Further, if necessary, at least one of the basic compound (D), the polymeric compound (E) and the optional components may also be mixed.

Effects

The conductive composition production method of the fourth embodiment of the present invention uses the water-soluble polymer (B) produced by the aforementioned water-soluble polymer production method of the third embodiment of the present invention, which prevents the water-soluble polymer (B2) from being mixed in.

Therefore, a conductive composition with the amount of the water-soluble polymer (B2) being suppressed to 0.15% by mass or less can be produced with high productively.

[Water-Soluble Polymer]

The fifth embodiment of the present invention relates to a water-soluble polymer which is a compound represented by the following formula (3).

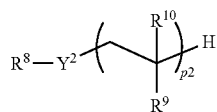

(3)

In the formula (3), $R^8$ denotes a linear or branched alkyl group with 6 to 20 carbon atoms, $R^9$ denotes a hydrophilic group, $R^{10}$ denotes a hydrogen atom or a methyl group, $Y^2$ denotes a single bond, —C(=O)—O— or —O—, and p2 denotes an average number of repetitions and is a number of more than 1 and not more than 50.

As examples of the alkyl group $R^8$, those mentioned above in the explanations on the water-soluble polymer (B1) can be listed.

$R^9$ is a hydrophilic group. The hydrophilic group is derived from the water-soluble vinyl monomer, which is the raw material monomer of the water-soluble polymer (B1). As examples of the water-soluble vinyl monomer, those mentioned above in the explanation on the water-soluble polymer (B1) can be listed.

In the formula (3), p2 is a number of more than 1 and 50 or less, preferably 2 or more, and more preferably 4 or more. Further, p2 is preferably 30 or less, and more preferably 20 or less. In particular, when p2 is 2 or more, the surface activity further improves.

The weight average molecular weight of the water-soluble polymer of the fifth embodiment of the invention is preferably 100 and 1,000,000, more preferably 100 to 100,000, and particularly preferably 600 and 10,000. When the weight average molecular weight of the water-soluble polymer is not less than the lower limit value described above, the conductive composition using the water-soluble polymer is more likely to show the effect of improving coatability. On the other hand, when the weight average molecular weight of the water-soluble polymer is not more than the upper limit value described above, the water solubility of the conductive composition is enhanced. In particular, when the weight average molecular weight of the water-soluble polymer is 600 or more and less than 2000, an excellent balance is achieved between the practical solubility thereof in water and the coatability of the conductive composition.

From the viewpoint of solubility etc., the water-soluble polymer of the fifth embodiment of the present invention is preferably the water-soluble polymer (B11), of which a compound of the formula (11) wherein $R^1$ is a linear or branched alkyl group having 6 to 20 carbon atoms, $Y^1$ is a single bond, —C(=O)—O— or —O—, and p1 is a number or more than 1 and 50 or less is particularly preferable.

The water-soluble polymer of the fifth embodiment of the present invention can be produced by the same method as the water soluble polymer production method of the third embodiment of the present invention. In the production, the p2 value is controlled by adjusting the ratio (molar ratio) of the polymerization initiator to the water-soluble vinyl monomer.

[Coating Film and Conductor]

The coating film (conductive coating film) obtained according to the present invention is formed from the conductive composition of the first or the second embodiment of the present invention.

The conductor obtained according to the present invention is obtained by coating or impregnating at least a part of a substrate with the conductive composition of the first or second embodiment of the present invention to form a coating film (conductive coating film) on the substrate. The conductor may have a resist layer formed on the coating film.

The substrate is not particularly limited as long as the effects of the present invention are obtained. Examples of the substrate include molded articles and films of various polymers such as polyester resins (e.g., PET and PBT), polyolefin resins represented by polyethylene and polypropylene, vinyl chloride, nylon, polystyrene, polycarbonate, epoxy resins, fluoro resins, polysulfone, polyimide, polyurethane, phenol resins, silicon resins, and synthetic papers; and papers, iron, glass, quartz glass, various wafers, aluminum, copper, zinc, nickel, stainless steel and the like; and products obtainable by coating surfaces of these substrates with various coating materials, photosensitive resins, resists and the like.

The shape of the substrate is not particularly limited and may be a plate or any other shape.

When the substrate is a plate, the coating film may be formed over the entire surface of one side of the substrate, or formed on a part of one side of the substrate. The coating film may also be formed on at least a part of the other side of the substrate. Further, the coating film may be formed on at least a part of the sides of the substrate.

When the substrate has a shape other than a plate, the coating film may be formed over the entire surface of the substrate or on a part of the surface of the substrate.

The method of applying the conductive composition to the substrate or impregnating the substrate with the conductive composition is not particularly limited as long as the effects of the present invention are obtained. Examples of the method include spin coating, spray coating, dip coating, roll coating, gravure coating, reverse coating, roll brush method, air knife coating and curtain coating.

The application of the conductive composition to the substrate or the impregnation of the substrate with the conductive composition may be performed before or during the process of producing the substrate, such as uniaxial stretching, biaxial stretching, molding, or embossing, or may be performed on the produced substrate after the aforementioned process.

Further, the conductive composition can be used to form a coating film by overcoating the substrate which has already been coated with various coating materials or photosensitive materials.

As for the method for producing the conductor, the conductor can be produced by a method in which the conductive composition is applied to or impregnated into at least a part of the substrate and dried to form a coating film, and allowed to stand for 1 minute to 60 minutes at normal temperature (25° C.) or subjected to heat treatment.

The heating temperature for the heat treatment is preferably in the range of 40° C. to 250° C., and more preferably in the range of 60° C. to 200° C., from the perspective of conductivity. Further, the time for heat treatment is preferably within 1 hour, and more preferably within 30 minutes, from the perspective of stability.

Other embodiments of the present invention are as enumerated below.

<1> A conductive composition including a conductive polymer (A), a water-soluble polymer (B), and a solvent (C1), wherein:
the water-soluble polymer (B) includes a water-soluble polymer (B11) represented by the formula (11) described above, and
an amount of a water-soluble polymer (B2) represented by the formula (2) described above as the water-soluble polymer (B) is 0.15% by mass or less, based on a total mass of the conductive composition.

<2> The conductive composition of <1> above, wherein the amount of the water-soluble polymer (B11) is 0.001 to 2% by mass, based on a total mass of the conductive composition.

<3> The conductive composition of <1> or <2> above, wherein the amount of the water-soluble polymer (B11) is 0.1 to 60% by mass, based on a total mass of solid components of the conductive composition.

<4> A conductive composition including a conductive polymer (A), a water-soluble polymer (B), a solvent (C1), and a basic compound (D), wherein:
the water-soluble polymer (B) includes a water-soluble polymer (B1) represented by the formula (1) described above, and
an amount of a water-soluble polymer (B2) represented by the formula (2) described above as the water-soluble polymer (B) is 0.15% by mass or less, based on a total mass of the conductive composition.

<5> The conductive composition of <4> above, wherein the amount of the water-soluble polymer (B1) is 0.001 to 1% by mass, based on a total mass of the conductive composition.

<6> The conductive composition of <4> or <5> above, wherein the amount of the water-soluble polymer (B1) is 0.1 to 20% by mass, based on a total mass of solid components of the conductive composition.

<7> The conductive composition of any one of <4> to <6> above, wherein the amount of the basic compound (D) is 0.1 to 70% by mass or less, based on a total mass of solid components of the conductive composition.

<8> The conductive composition according to any one of <4> to <7>, wherein the water-soluble polymer (B1) is a water-soluble polymer (B11) represented by formula (11).

<9> The conductive composition according to any one of <1> to <8> above, wherein the amount of the conductive polymer (A) is 0.1 to 5% by mass or less, based on a total mass of the conductive composition.

<10> The conductive composition according to any one of <1> to <9> above, wherein the amount of the conductive polymer (A) is 50 to 99.9% by mass or less, based on a total mass of solid components of the conductive composition.

<11> The conductive composition according to any one of <1> to <10> above, wherein the amount of the water-soluble polymer (B2) is less than 0.005% by mass, based on a total mass of the conductive composition.

<12> The conductive composition of any one of <1> to <11> above, wherein the amount of the water-soluble polymer (B2) is 7% by mass or less, based on a total mass of solid components of the conductive composition.

<13> The conductive composition according to any one of <1> to <12> above, wherein the amount of the solvent (C1) is 1 to 99% by mass, based on a total mass of the conductive composition.

<14> The conductive composition according to any one of <1> to <13> above, wherein a water/octanol partition coefficient (Log P) for polymerization initiator-derived components in the water-soluble polymer (B) is 8.50 or more.

<15> The conductive composition according to any one of <1> to <14>, wherein the conductive polymer (A) is polyaniline sulfonic acid.

<16> The conductive composition according to any one of <1> to <15>, wherein the conductive polymer (A) has a unit represented by the formula (7).

<17> A method for producing a water-soluble polymer (B) comprising a water-soluble polymer (B1) represented by the formula (1), the method including a polymerization step of polymerizing a water-soluble vinyl monomer in a solvent (C2) satisfying condition 1 in the presence of a polymerization initiator having a terminal hydrophobic group:

Condition 1: a chain transfer constant of methyl acrylate to the solvent (C2) at 50° C. is 0.001 or less.

<18> The method of <17> above, wherein the molar ratio of the polymerization initiator to the water-soluble vinyl monomer (polymerization initiator:water-soluble vinyl monomer) is 0.001:1 to 0.5:1.

<19> The method according to <17> or <18>, wherein the polymerization step is performed in the presence of a chain transfer agent having a terminal hydrophobic group.

<20> The method of <19> above, wherein the molar ratio of the chain transfer agent to the water-soluble vinyl monomer (chain transfer agent:water-soluble vinyl monomer) is 0.001:1 to 0.1:1.

<21> The method of any one of <17> to <20> above, wherein a solvent (C3) not satisfying the condition 1 is used in combination with the solvent (C2) in the polymerization step.

<22> The method of <21> above, wherein the volume ratio of the solvent (C2) to the solvent (C3) (solvent (C2):solvent (C3)) is 1:0.01 to 1:1.

<23> A method for producing a conductive composition, including a step of producing the water-soluble polymer (B) by the method of any one of <17> to <22>, and a step of mixing the obtained water-soluble polymer (B) with a conductive polymer (A) and a solvent (C1).

<24> The method of <23> above, which further includes mixing with a basic compound (D).

<25> A water-soluble polymer represented by the formula (3).

<26> The water-soluble polymer of <25> above, which is a water-soluble polymer (B11) represented by the formula (11).

<27> A coating film formed of the conductive composition of any one of <1> to <16> above.

<28> A conductor including a substrate and a coating film of <27> above formed on the substrate.

<29> The conductor of <28> above, which further includes a resist layer formed on the coating film.

<30> A method for producing a conductor, which includes coating or impregnating at least a part of a substrate with the conductive composition of any one of <1> to <16> above, followed by drying to form a coating film.

<31> The method of <30> above, which further includes forming a resist layer on the coating film.

EXAMPLES

Hereinbelow, the present invention will be specifically described in more detail by way of Examples which should not be construed as limiting the present invention.

The various measurements and evaluations were performed in the Examples and Comparative Examples by respective methods as described below.

[Measurement and Evaluation Methods]
<Evaluation of Coatability>

10 mL of a measurement sample was poured into a 30 mL petri dish.

The surface tension was measured by the plate method (Wilhelmy method) using a surface tension meter while keeping the temperature of the measurement sample at 25° C.

<Evaluation of Conductivity>

1.3 mL of the conductive polymer solution or the conductive composition was dropped onto a 4-inch silicon wafer as a substrate, and spin-coated on the substrate so as to cover the entire surface of the substrate using a spin coater under the condition of 2000 rpm for 60 seconds. The resulting was heat-treated on a hot plate at 80° C. for 2 minutes to form a coating film with a thickness of about 20 nm on the substrate.

The surface resistivity [Ω/□] of the coating film was measured by the 2-terminal method (distance between the electrodes=20 mm) using Hiresta X-MCP-HT800 (manufactured by Mitsubishi Chemical Analytech Co., Ltd.).

<Evaluation of Influence on Resist Layer: Visual Evaluation>

(Visual Evaluation Method)

Using a chemically amplified electron beam resist (hereinafter simply referred to as "resist"), the influence of the conductive film on a resist layer was visually evaluated following the steps (1A) to (4A) described below.

(1A) Formation of resist layer: a resist was spin-coated onto a 4-inch silicon wafer so as to give a resist thickness of 0.2 μm using a spin coater at 2000 rpm for 60 seconds, followed by pre-baking at 130° C. for 90 seconds on a hot plate to remove the solvent and form a resist layer on the substrate.

(2A) Formation of conductive film: 2 μL of a conductive composition was dropped onto the resist layer, and spin-coated on the resist layer so as to cover a part of the entire surface of the resist layer using a spin coater under the condition of 2000 rpm for 60 seconds. The resulting was heat-treated on a hot plate at 80° C. for 3 minutes to form a conductive film with a thickness of about 30 nm on the resist layer.

(3A) Washing with water: The conductive film was washed by running 20 mL of water, and spun at 2,000 rpm for 60 seconds using a spin coater to remove water from the surface of the resist layer.

(4A) Evaluation of resist layer after removal of conductive film: The resist layer was visually observed with respect to its portion from which the coated conductive film had been removed as well as its portion which had not been coated with the conductive film. The results were evaluated as (A) indicating no influence when no film color change occurred or (B) indicating the presence of influence when film color change occurred.

<Analysis of Water-Soluble Polymer (B)>

(Measurement of Mass Ratio of Water-Soluble Polymer (B1) and Water-Soluble Polymer (B2))

The water-soluble polymer (B) was analyzed by high performance liquid chromatography under the following conditions. The structures of the peaks were determined by a mass spectrometer, and the mass ratio of the water-soluble polymer (B1) and the water-soluble polymer (B2) was determined by a charged particle detector.

<<Analysis Conditions>>

Column: C18 reversed-phase column (ODS)

Mobile phase: A=water, B=acetonitrile/isopropyl alcohol=50/50 (vol %), gradient analysis from A (98% by mass)+B (2% by mass) to B (100% by mass)

Detectors: Mass spectrometer (TOF-MS) and charged particle Detector (CAD)

(Measurement of Molecular Weight of Water-Soluble Polymer (B))

A 0.1% by mass aqueous solution of the water-soluble polymer (B) was filtered through a 0.45 μm membrane filter to prepare a sample. The GPC analysis of the sample was performed under the conditions described below to measure the weight average molecular weight of the water-soluble polymer (B).

<<GPC Measurement Conditions>>
 Measuring apparatus: TOSOH GPC-8020 (manufactured by Tosoh Corporation)
 Eluent: 0.2 M-NaNO₃-DIW/acetonitrile=80/20 (v/v)
 Column temperature: 30° C.
 Calibration curve: prepared using EasiVial™ polyethylene glycol/oxide (manufactured by PolymerLab)
[Production of Conductive Polymer (A)]

Production Example 1: Production of Conductive Polymer (a-1)

100 mmol of 2-aminoanisole-4-sulfonic acid was dissolved in 4 mol/L of an aqueous ammonia solution at 25° C. to obtain a monomer solution. 100 mmol of an aqueous solution of ammonium peroxodisulfate was dropped into the obtained monomer solution. After completion of the dropwise addition, the resulting mixture was further stirred at 25° C. for 12 hours to obtain a reaction mixture containing a conductive polymer. Thereafter, the conductive polymer was separated from the reaction mixture by a centrifugal filter. The obtained conductive polymer was washed with methanol and then dried to obtain 15 g of a powdery conductive polymer (a-1).

The conductive polymer (a-1) was dissolved in 0.2 mol/L of aqueous ammonia to thereby prepare a conductive polymer solution. The obtained conductive polymer solution was used to form a coating film, and the surface resistivity thereof was measured.

The volume resistivity was found to be 9.0 Ω-cm, which was obtained by multiplying the surface resistivity by the film thickness.

[Production of Water-Soluble Polymer (B)]

Production Example 2: Production of Water-Soluble Polymer (b-1)

55 g (0.49 mol) of N-vinyl pyrrolidone as a water-soluble vinyl monomer, 3 g (7.53 mmol) of dilauroyl peroxide as a polymerization initiator, and 1 g (4.94 mmol) of n-dodecyl mercaptan as a chain transfer agent were dissolved into 100 mL of methyl isobutyl ketone as a solvent (C2), and the resulting was stirred to obtain a reaction solution. Then, the reaction solution was dropped into 100 mL of isopropyl alcohol as a solvent (C3), which had been heated to 80° C. beforehand, at a dropping rate of 1 mL/min to carry out drop polymerization. The drop polymerization was carried out while keeping the temperature of isopropyl alcohol at 80° C. After the dropping was completed, the resulting was matured at 80° C. for another 2 hours and then allowed to cool. The resulting was concentrated under reduced pressure and dissolved in 30 mL of acetone to obtain a water-soluble polymer solution. The obtained water-soluble polymer solution was added to 1000 mL of n-hexane to form white precipitates, which were then separated as a residue by filtration. The obtained water-soluble polymer was washed with n-hexane and then dried to obtain 48 g of a powder of the water-soluble polymer (b-1).

Note that the chain transfer constant of methyl acrylate to methyl isobutyl ketone at 50° C. is 0.001 or less.

Further, the water/octanol partition coefficient of dilauroyl peroxide is 10.1.

The obtained water-soluble polymer (b-1) was analyzed, and the results showed that the obtained water-soluble polymer (b-1) was a mixture of a water-soluble polymer (B1), which is a compound represented by formula (11-1) below, and a water-soluble polymer (B2), which is a compound represented by formula (2-1) below. The mass ratio, water-soluble polymer (B1):water-soluble polymer (B2), was 40:60. The compound represented by the formula (11-1) also falls under the water-soluble polymer (B11).

The weight average molecular weight of the water-soluble polymer (b-1) was 2200.

0.1 part by mass of the water-soluble polymer (b-1) was dissolved in 100 parts by mass of water, and the surface tension of the resulting was measured and found to be 35 mN/m.

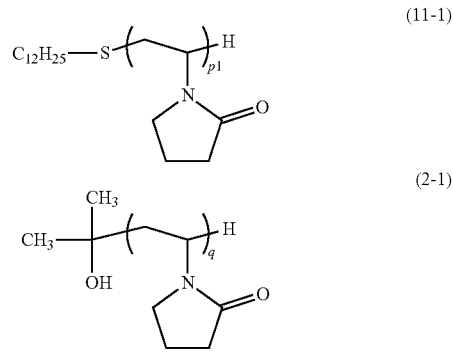

Production Example 3: Production of Water-Soluble Polymer (b-2)

46 g of a powder of water-soluble polymer (b-2) was obtained in the same manner as in Production Example 2, except that 6 g of dilauroyl peroxide was used as the polymerization initiator, 100 mL of ethyl acetate was used as the solvent (C2), and 100 mL of ethyl acetate was used instead of the solvent (C3).

Note that the chain transfer constant of methyl acrylate to ethyl acetate at 50° C. is 0.001 or less.

The obtained water-soluble polymer (b-2) was analyzed, and the results showed that the obtained water-soluble polymer (b-2) was a water-soluble polymer (B1), which is a compound represented by the above formula (11-1), and included no water-soluble polymer (B2).

The weight average molecular weight of the water-soluble polymer (b-2) was 5300.

0.1 part by mass of the water-soluble polymer (b-2) was dissolved in 100 parts by mass of water, and the surface tension of the resulting was measured and found to be 28 mN/m.

Production Example 4: Production of Water-Soluble Polymer (b-3)

45 g of a powder of water-soluble polymer (b-3) was obtain in the same manner as in Production Example 2, except that 3 g of azobis-methylbutyronitrile was used as the polymerization initiator and 100 mL of isopropyl alcohol was used instead of the solvent (C2).

Note that the chain transfer constant of methyl acrylate to isopropyl alcohol at 50° C. is 0.0013.

The obtained water-soluble polymer (b-3) was analyzed, and the results showed that the obtained water-soluble polymer (b-3) was a mixture of a water-soluble polymer (B1), which is a compound represented by the formula (11-1), a water-soluble polymer (B2), which is a compound represented by the formula (2-1), and a water-soluble polymer (B2), which is a compound represented by formula (2-2) shown below. The mass ratio, water-soluble polymer (B1): water-soluble polymer (B2), was 10:90.

The weight average molecular weight of the water-soluble polymer (b-3) was 1100.

0.1 part by mass of the water-soluble polymer (b-3) was dissolved in 100 parts by mass of water, and the surface tension of the resulting was measured and found to be 56 mN/m.

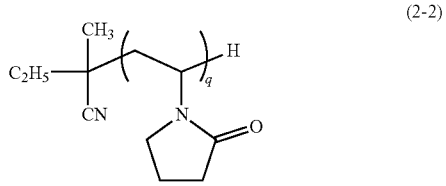

(2-2)

Example 1

1.8 parts by mass of the conductive polymer (a-1), 0.2 parts by mass of the water-soluble polymer (b-1), 94 parts by mass of water, and 4 parts by mass of isopropyl alcohol (IPA) were mixed together to prepare a conductive composition with a solids concentration of 2% by mass.

With respect to the obtained conductive composition, the amount of the conductive polymer (a-1) was 1.8% by mass, the amount of the water-soluble polymer (B1) was 0.08% by mass, the amount of the water-soluble polymer (B2) was 0.12% by mass, and the sum of the amounts of water and isopropyl alcohol was 98% by mass, each based on the total mass of the conductive composition.

Further, the amount of the conductive polymer (a-1) was 90% by mass, the amount of the water-soluble polymer (B11 was 4% by mass, and the amount of the water-soluble polymer (B2) was 6% by mass, each based on a total mass of solid components of the conductive composition.

The obtained conductive composition was evaluated in terms of coatability and conductivity. The results are shown in Table 1.

Example 2

1.98 parts by mass of the conductive polymer (a-1), 0.02 parts by mass of the water-soluble polymer (b-1), 94 parts by mass of water, and 4 parts by mass of isopropyl alcohol were mixed together to prepare a conductive composition.

With respect to the obtained conductive composition, the amount of the conductive polymer (a-1) was 1.98% by mass, the amount of the water-soluble polymer (B1) was 0.008% by mass, the amount of the water-soluble polymer (B2) was 0.012% by mass, and the sum of the amounts of water and isopropyl alcohol was 98% by mass, each based on the total mass of the conductive composition.

Further, the amount of the conductive polymer (a-1) was 99% by mass, the amount of the water-soluble polymer (B1) was 0.4% by mass, and the amount of the water-soluble polymer (B2) was 0.6% by mass, each based on a total mass of solid components of the conductive composition.

The obtained conductive composition was evaluated in terms of coatability and conductivity. The results are shown in Table 1.

Example 3

1.8 parts by mass of the conductive polymer (a-1), 0.2 parts by mass of the water-soluble polymer (b-2), 94 parts by mass of water, and 4 parts by mass of isopropyl alcohol were mixed together to prepare a conductive composition.

With respect to the obtained conductive composition, the amount of the conductive polymer (a-1) was 1.8% by mass, the amount of the water-soluble polymer (B1) was 0.2% by mass, the amount of the water-soluble polymer (B2) was 0% by mass, and the sum of the amounts of water and isopropyl alcohol was 98% by mass, each based on the total mass of the conductive composition.

Further, the amount of the conductive polymer (a-1) was 90% by mass, the amount of the water-soluble polymer (B1) was 10% by mass, and the amount of the water-soluble polymer (B2) was 0% by mass, each based on a total mass of solid components of the conductive composition.

The obtained conductive composition was evaluated in terms of coatability and conductivity. The results are shown in Table 1.

Example 4

1.98 parts by mass of the conductive polymer (a-1), 0.02 parts by mass of the water-soluble polymer (b-1), 94 parts by mass of water, and 4 parts by mass of isopropyl alcohol were mixed together to prepare a conductive composition.

With respect to the obtained conductive composition, the amount of the conductive polymer (a-1) was 1.98% by mass, the amount of the water-soluble polymer (B1) was 0.02% by mass, the amount of the water-soluble polymer (B2) was 0% by mass, and the sum of the amounts of water and isopropyl alcohol was 98% by mass, each based on the total mass of the conductive composition.

Further, the amount of the conductive polymer (a-1) was 99% by mass, the amount of the water-soluble polymer (B1) was 1% by mass, and the amount of the water-soluble polymer (B2) was 0% by mass, each based on a total mass of solid components of the conductive composition.

The obtained conductive composition was evaluated in terms of coatability and conductivity. The results are shown in Table 1.

Comparative Example 1

1.8 parts by mass of the conductive polymer (a-1), 0.2 parts by mass of the water-soluble polymer (b-3), 94 parts by mass of water, and 4 parts by mass of isopropyl alcohol were mixed together to prepare a conductive composition.

With respect to the obtained conductive composition, the amount of the conductive polymer (a-1) was 1.8% by mass, the amount of the water-soluble polymer (B1) was 0.02% by mass, the amount of the water-soluble polymer (B2) was 0.18% by mass, and the sum of the amounts of water and isopropyl alcohol was 98% by mass, each based on the total mass of the conductive composition.

Further, the amount of the conductive polymer (a-1) was 90% by mass, the amount of the water-soluble polymer (B1) was 1% by mass, and the amount of the water-soluble polymer (B2) was 9% by mass, each based on a total mass of solid components of the conductive composition.

The obtained conductive composition was evaluated in terms of coatability and conductivity. The results are shown in Table 1.

TABLE 1

|  |  | Ex. 1 | Ex. 2 | Ex. 3 | Ex. 4 | Comp. Ex. 1 |
|---|---|---|---|---|---|---|
| Conductive polymer (A) | Type | a-1 | a-1 | a-1 | a-1 | a-1 |
|  | Amount [Part by mass] | 1.8 | 1.98 | 1.8 | 1.98 | 1.8 |
| Water-soluble polymer (B) | Type | b-1 | b-1 | b-2 | b-2 | b-3 |
|  | Amount [Part by mass] | 0.2 | 0.02 | 0.2 | 0.02 | 0.2 |
|  | Polymerization initiator | LPO | LPO | LPO | LPO | AMBN |
|  | Chain transfer agent | n-DM | n-DM | n-DM | n-DM | n-DM |
|  | Polymerization solvent | MIBK, IPA | MIBK, IPA | Ethyl acetate | Ethyl acetate | IPA |
| Solvent (C1) | Water [Part by mass] | 94 | 94 | 94 | 94 | 94 |
|  | IPA [Part by mass] | 4 | 4 | 4 | 4 | 4 |
| Amount in conductive composition [% by mass] | Conductive polymer (A) | 1.8 | 1.98 | 1.8 | 1.98 | 1.8 |
|  | Water-soluble polymer (B1) | 0.08 | 0.008 | 0.2 | 0.02 | 0.02 |
|  | Water-soluble polymer (B2) | 0.12 | 0.012 | 0 | 0 | 0.18 |
|  | Solvent (C1) | 98 | 98 | 98 | 98 | 98 |
| Amount in solids [% by mass] | Conductive polymer (A) | 90 | 99 | 90 | 99 | 90 |
|  | Water-soluble polymer (B1) | 4 | 0.4 | 10 | 1 | 1 |
|  | Water-soluble polymer (B2) | 6 | 0.6 | 0 | 0 | 9 |
| Evaluation of coatability | Surface tension [mN/m] | 27.9 | 45.7 | 30.6 | 43 | 49.6 |
| Evaluation of conductivity | Surface resistivity [Ω/□] | $6.41 \times 10^6$ | $2.67 \times 10^6$ | $2.94 \times 10^6$ | $1.32 \times 10^6$ | $5.32 \times 10^6$ |

Abbreviations and acronyms in Table 1 stand for the following compounds.
LPO: Dilauroyl peroxide
AMBN: Azo-bis-methylbutyronitrile
n-DM: n-dodecyl mercaptan
MIBK: Methyl isobutyl ketone
IPA: Isopropyl alcohol As evident from Table 1, comparison between Example 1, Example 3 and Comparative Example 1 shows that, though the amount of the water-soluble polymer (b-1) or the water-soluble polymer (b-2) and the amount of the water-soluble polymer (b-3) were the same, the conductive compositions obtained in Examples 1 and 3 had a lower surface tension and hence a superior coatability as compared to the conductive composition obtained in Comparative Example 1. In particular, the coating film formed from the conductive composition obtained in Example 3 had excellent conductivity.

Comparison between Example 2, Example 4 and Comparative Example 1 shows that, though the amount of the water-soluble polymer (b-1) or the water-soluble polymer (b-2) was smaller than the amount of the water-soluble polymer (b-3), the conductive compositions obtained in Examples 2 and 4 had a lower surface tension and hence a superior coatability as compared to the conductive composition obtained in Comparative Example 1. Further, though the solids concentrations of the conductive compositions obtained in Examples 2 and 4 and the solids concentration of the conductive composition obtained in Comparison Example 1 were the same, the coating films formed from the conductive compositions obtained in Examples 2 and 4 had a superior conductivity to the coating film formed from the conductive composition obtained in Comparative Example 1.

Example 5

1.4 parts by mass of the conductive polymer (a-1), 0.2 parts by mass of the water-soluble polymer (b-1), 94 parts by mass of water, 4 parts by mass of isopropyl alcohol (IPA), and 0.4 parts by mass of pyridine were mixed together to prepare a conductive composition with a solids concentration of 2% by mass.

With respect to the obtained conductive composition, the amount of the conductive polymer (a-1) was 1.4% by mass, the amount of the water-soluble polymer (B1) was 0.08% by mass, the amount of the water-soluble polymer (B2) was 0.12% by mass, the sum of the amounts of water and isopropyl alcohol was 98% by mass, and the amount of pyridine was 0.4% by mass, each based on the total mass of the conductive composition.

Further, the amount of the conductive polymer (a-1) was 70% by mass, the amount of the water-soluble polymer (B1) was 4% by mass, the amount of the water-soluble polymer (B2) was 6% by mass, and the amount of pyridine was 20% by mass, each based on a total mass of solid components of the conductive composition.

The obtained conductive composition was evaluated in terms of coatability, conductivity and influence on resist layer. The results are shown in Table 2.

Example 6

1.52 parts by mass of the conductive polymer (a-1), 0.02 parts by mass of the water-soluble polymer (b-1), 94 parts by mass of water, 4 parts by mass of isopropyl alcohol (IPA), and 0.46 parts by mass of pyridine were mixed together to prepare a conductive composition with a solids concentration of 2% by mass.

With respect to the obtained conductive composition, the amount of the conductive polymer (a-1) was 1.52% by mass, the amount of the water-soluble polymer (B1) was 0.008% by mass, the amount of the water-soluble polymer (B2) was 0.012% by mass, the sum of the amounts of water and isopropyl alcohol was 98% by mass, and the amount of pyridine was 0.46% by mass, each based on the total mass of the conductive composition.

Further, the amount of the conductive polymer (a-1) was 76% by mass, the amount of the water-soluble polymer (B1) was 0.4% by mass, the amount of the water-soluble polymer (B2) was 0.6% by mass, and the amount of pyridine was 23% by mass, each based on a total mass of solid components of the conductive composition.

The obtained conductive composition was evaluated in terms of coatability, conductivity and influence on resist layer. The results are shown in Table 2.

Comparative Example 2

A conductive composition with a solids concentration of 2% by mass was prepared in the same manner as in Comparative Example 1.

With respect to the obtained conductive composition, the amount of the conductive polymer (a-1) was 1.8% by mass, the amount of the water-soluble polymer (B1) was 0.02% by mass, the amount of the water-soluble polymer (B2) was 0.18% by mass, and the sum of the amounts of water and isopropyl alcohol was 98% by mass, each based on the total mass of the conductive composition.

Further, the amount of the conductive polymer (a-1) was 90% by mass, the amount of the water-soluble polymer (B1) was 1% by mass, and the amount of the water-soluble polymer (B2) was 9% by mass, each based on a total mass of solid components of the conductive composition.

The obtained conductive composition was evaluated in terms of coatability, conductivity and influence on resist layer. The results are shown in Table 2.

TABLE 2

|  |  | Ex. 5 | Ex. 6 | Comp. Ex. 2 |
| --- | --- | --- | --- | --- |
| Conductive polymer (A) | Type | a-1 | a-1 | a-1 |
|  | Amount [Part by mass] | 1.4 | 1.52 | 1.8 |
| Water-soluble polymer (B) | Type | b-1 | b-1 | b-3 |
|  | Amount [Part by mass] | 0.2 | 0.02 | 0.2 |
|  | Polymerization initiator | LPO | LPO | AMBN |
|  | Chain transfer agent | n-DM | n-DM | n-DM |
|  | Polymerization solvent | MIBK, IPA | MIBK, IPA | IPA |
| Solvent (C1) | Water [Part by mass] | 94 | 94 | 94 |
|  | IPA [Part by mass] | 4 | 4 | 4 |
| Basic compound (D) | Type | Py | Py | — |
|  | Amount [Part by mass] | 0.4 | 0.46 | 0 |
| Amount in conductive composition [% by mass] | Conductive polymer (A) | 1.4 | 1.52 | 1.8 |
|  | Water-soluble polymer (B1) | 0.08 | 0.008 | 0.02 |
|  | Water-soluble polymer (B2) | 0.12 | 0.012 | 0.18 |
|  | Solvent (C1) | 98 | 98 | 98 |
|  | Basic compound (D) | 0.4 | 0.46 | 0 |
| Amount in solids [% by mass] | Conductive polymer (A) | 70 | 76 | 90 |
|  | Water-soluble polymer (B1) | 4 | 0.4 | 1 |
|  | Water-soluble polymer (B2) | 6 | 0.6 | 9 |
|  | Basic compound (D) | 20 | 23 | 0 |
| Evaluation of coatability | Surface tension [mN/m] | 27.9 | 45.7 | 49.6 |
| Evaluation of conductivity | Surface resistivity [Ω/□] | $6.41 \times 10^6$ | $2.67 \times 10^6$ | $5.32 \times 10^6$ |
| Evaluation of influence on resist |  | A | A | B |

Abbreviations and acronyms in Table 2 stand for the following compounds.

LPO: Dilauroyl peroxide
AMBN: Azo-bis-methylbutyronitrile
n-DM: n-dodecyl mercaptan
MIBK: Methyl isobutyl ketone
IPA: Isopropyl alcohol
Py: Pyridine As evident from Table 2, comparison between Example 5 and Comparative Example 2 shows that, though the amount of the water-soluble polymer (b-1) and the amount of the water-soluble polymer (b-3) were the same, the conductive composition obtained in Example 5 had a lower surface tension and hence a superior coatability as compared to the conductive composition obtained in Comparative Example 2. From the conductive composition obtained in Example 5, a conductive film with less film reduction of the resist layer, i.e., with less influence on the resist layer, could be formed.

Comparison between Example 6 and Comparative Example 2 shows that, though the amount of the water-soluble polymer (b-1) was smaller than the amount of the water-soluble polymer (b-3), the conductive composition obtained in Example 6 had a lower surface tension and hence a superior coatability as compared to the conductive composition obtained in Comparative Example 2. Further, though the solids concentration of the conductive composition obtained in Example 6 and the solids concentration of the conductive composition obtained in Comparison Example 2 were the same, the coating film formed from the conductive composition obtained in Example 6 had a superior conductivity to the coating film formed from the conductive composition obtained in Comparative Example 2. From the conductive composition obtained in Example 6, a conductive film with less film reduction of the resist layer, i.e., with less influence on the resist layer, could be formed.

INDUSTRIAL APPLICABILITY

The conductive composition of the present invention can form a coating film with excellent coatability and conductivity and hence can be used as an antistatic agent applicable even to the semiconductor devices of the next-generation process.

The invention claimed is:
1. A conductive composition, comprising:
a conductive polymer (A);
a water-soluble polymer (B); and
a solvent (C1), wherein the water-soluble polymer (B) comprises a water-soluble polymer (B11) of formula (11), and a water-soluble polymer (B2),
wherein the water-soluble polymer (B2) is present in 0.15% by mass or less, based on total conductive composition mass,
wherein the water-soluble polymer (B11) has formula (11):

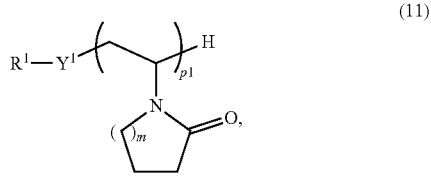

$R^1$ being a linear or branched alkyl group with 6 to 20 carbon atoms, $Y^1$ being a single bond, —S—, —S(=O)—, —C(=O)—O—, or —O—, p1 being an average number of repetitions and is a number in a range of from 1 to 50, and m is a number in a range of from 1 to 5,
wherein the water-soluble polymer (B2) has formula (2);

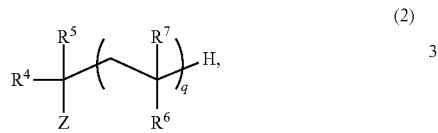

each of $R^4$ and $R^5$ independently being a methyl or ethyl group, $R^6$ being a hydrophilic group, $R^7$ being H or a methyl group, Z being a cyano group or a hydroxy group, and q being an average number of repetitions and a number in a range of from 1 to 50,
wherein a (B2)/(B11) ratio, of the water-soluble polymer (B2) to the water-soluble polymer (B11), is less than 9, and
wherein a water/octanol partition coefficient (Log P) for polymerization initiator-derived components in the water-soluble polymer (B) is 8.50 or more.

2. The composition of claim 1, wherein the conductive polymer (A) is polyaniline comprising a sulfonic acid substituent.

3. The composition of claim 1, wherein the water-soluble polymer (B2), based on the total conductive composition mass, is present in up to 0.005% by mass.

4. The composition of claim 1, wherein the water-soluble polymer (B) comprises a first and a second species of the water-soluble polymer (B11).

5. The composition of claim 1, wherein the water-soluble polymer (B) comprises
a first species (B11a) of the water-soluble polymer (B11) wherein $Y^1$ is —S—, and
a second species (B11b) of the water-soluble polymer (B11) wherein $Y^1$ is a single bond, —S(=O)—, —C(=O)—O—, or —O—.

6. The composition of claim 1, wherein the water-soluble polymer (B) comprises
a first species (B11a) of the water-soluble polymer (B11) wherein $Y^1$ is —S—, and
a second species (B11b) of the water-soluble polymer (B11) wherein $Y^1$ is —C(=O)—O—.

7. The composition of claim 1, wherein the water-soluble polymer (B) comprises only two species of the water-soluble polymer (B11).

8. The composition of claim 1, wherein, in the water-soluble polymer (B11), $R^1$ is the linear alkyl group with 6 to 20 carbon atoms.

9. The composition of claim 1, wherein, in the water-soluble polymer (B11), $Y^1$ is the single bond.

10. The composition of claim 1, wherein, in the water-soluble polymer (B11), $Y^1$ is —S—.

11. The composition of claim 1, wherein, in the water-soluble polymer (B11), $Y^1$ is —S(=O)—.

12. The composition of claim 1, wherein, in the water-soluble polymer (B11), $Y^1$ is —C(=O)—O—.

13. The composition of claim 1, wherein, in the water-soluble polymer (B11), $Y^1$ is —O—.

14. A composition, comprising:
a conductive polymer (A);
a water-soluble polymer (B); and
a solvent (C1),
wherein the water-soluble polymer (B) comprises a water-soluble polymer (B11) of formula (11), and a water-soluble polymer (B2),
wherein the water-soluble polymer (B2) is present in 0.15% by mass or less, based on total conductive composition mass,
wherein the water-soluble polymer (B11) has formula (11):

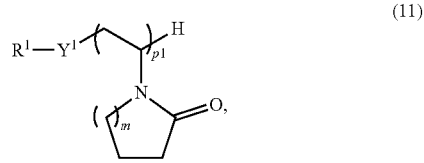

$R^1$ being a linear or branched alkyl group with 6 to 20 carbon atoms, $Y^1$ being a single bond, —S—, —S(=O)—, —C(=O)—O—, or —O—, p1 being an average number of repetitions and is a number in a range of from 1 to 50, and m is a number in a range of from 1 to 5,
wherein the water-soluble polymer (B2) has formula (2):

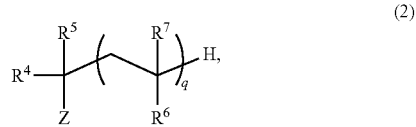

each of $R^4$ and $R^5$ independently being a methyl or ethyl group, $R^6$ being a hydrophilic group, $R^7$ being H or a methyl group, Z being a cyano group or a hydroxy group, and q being an average number of repetitions and a number in a range of from 1 to 50,
wherein a (B2)/(B11) ratio, of the water-soluble polymer (B2) to the water-soluble polymer (B11), is no more than 1.5, and
wherein a water/octanol partition coefficient (Log P) for polymerization initiator-derived components in the water-soluble polymer (B) is 8.50 or more.

15. The composition of claim 14, wherein the conductive polymer (A) is polyaniline comprising a sulfonic acid substituent.

16. The composition of claim 14, wherein the water-soluble polymer (B2), based on the total conductive composition mass, is present in up to 0.005% by mass.

17. The composition of claim 14, wherein the water-soluble polymer (B) comprises a first and a second species of the water-soluble polymer (B11).

18. The composition of claim 14, wherein the water-soluble polymer (B) comprises
- a first species (B11a) of the water-soluble polymer (B11) wherein $Y^1$ is —S—, and
- a second species (B11b) of the water-soluble polymer (B11) wherein $Y^1$ is a single bond, —S(=O)—, —C(=O)—O—, or —O—.

19. The composition of claim 14, wherein the water-soluble polymer (B) comprises
- a first species (B11a) of the water-soluble polymer (B11) wherein $Y^1$ is —S—, and
- a second species (B11b) of the water-soluble polymer (B11) wherein $Y^1$ is —C(=O)—O—.

20. The composition of claim 14, wherein the water-soluble polymer (B) comprises only two species of the water-soluble polymer (B11).

* * * * *